US012704561B2

(12) United States Patent
Jiang

(10) Patent No.: US 12,704,561 B2
(45) Date of Patent: Aug. 11, 2026

(54) INSTRUMENT FOR CHECKING WHETHER THE BAND CABLE IS HETEROGENEOUS

(71) Applicant: SEWON ELECTRONICS CO., LTD., Pyeongtaek-Si (KR)

(72) Inventor: Pengtao Jiang, Weihai City (CN)

(73) Assignee: SEWON ELECTRONICS CO., LTD., Pyeongtaek-si (KR)

( * ) Notice: Subject to any disclaimer, the term of this patent is extended or adjusted under 35 U.S.C. 154(b) by 433 days.

(21) Appl. No.: 18/530,333

(22) Filed: Dec. 6, 2023

(65) Prior Publication Data

US 2024/0183917 A1 Jun. 6, 2024

(30) Foreign Application Priority Data

Dec. 6, 2022 (KR) ........................ 10-2022-0168463

(51) Int. Cl.
*G01R 31/58* (2020.01)

(52) U.S. Cl.
CPC .................................... *G01R 31/58* (2020.01)

(58) Field of Classification Search
CPC ..................................................... G01R 31/58
See application file for complete search history.

(56) References Cited

FOREIGN PATENT DOCUMENTS

CN 106885970 A * 6/2017 ........... G01R 31/083
CN 119450890 B * 2/2026 ........... H05K 1/0224

* cited by examiner

*Primary Examiner* — Jamel E Williams
(74) *Attorney, Agent, or Firm* — Hauptman Ham, LLP

(57) ABSTRACT

The present instrument for checking whether a band cable is heterogeneous comprises: an anchor block configured to have a vertically penetrating a receiving tube into which a fastener of a band cable can be inserted when the fastener has a specific shape; a base platform configured to form a seating plane, on its upper surface, on which the anchor block is detachably mounted, to have a plurality of switches installed inside, each equipped with an up-down pin that can move vertically, so that they are spaced apart from each other by a certain distance and their up-down pins protrude above the seating plane by a predetermined height; and a latch plate configured to be capable of blocking at least a portion of upper side of the receiving tube.

27 Claims, 22 Drawing Sheets

<a> <b>

Note
: Point of a pin switch where the up-down pin is located when inserting a fastener into an anchor block, <a>

<b>

SECTION A-A

<c>

<a>

<b>

<a>

<b>

<a>

<b>

<a>

<b>

<a>

<b>

Section A-A

<a>

<b>

INSTRUMENT FOR CHECKING WHETHER THE BAND CABLE IS HETEROGENEOUS

CROSS REFERENCE TO RELATED APPLICATION

This application claims the priority of Korean Application No. 10-2022-0168463, filed on Dec. 6, 2022. The entire disclosure of the above application is incorporated herein by reference.

BACKGROUND

Field

The present invention relates to an instrument for checking whether a band cable to wrap around and bind wires forming a wiring harness is of the type specified for that harness.

Description of the Related Art

These days, many kinds of devices and appliances are used in daily life, work, leisure activities or medical practices etc. of people. Most of them perform the intended operations or functions based on electrical signal exchanges among their components. Particularly, a large-sized equipment, for example, a vehicle, a communication device, a medical device or the like connects many kinds of cables to each other among a large number of components to enable electrical communication therebetween.

Since devices with more complex functions have more wires connected between components or with a power supply, generally, wires extending to the same or adjacent points are wrapped and bound by one or more band cables to form a bundle. This is to prevent a part of the wiring from interfering with or becoming tangled with other surrounding parts or devices. Wires manufactured in a bundle like this, with one or more connectors connected to both ends, are generally referred to as "wiring harness".

And, when the wiring harness is mounted on a target apparatus such as a vehicle that operates in an environment where vibration is continuously applied, not only both ends of the wiring harness but also the wiring bundle is fixed to the frame or pad of that apparatus. This fixation is mainly achieved by a band cable equipped with a fastener at the end.

When using this type of band cable, a receiving structure corresponding to the fastener is prepared on a frame or pad at the position where the band cable binding the wiring harness is located. Thus, the fastener of the band cable is inserted into the receiving structure, thereby securing the bundle of wiring harness in that position.

However, band cables with different fastener shapes may be used depending on the type of harness applied, the location in the target apparatus where the harness is installed, the direction of the wire at that location, or the degree of adhesion that must be maintained between the band cable and the receiving structure end.

In the case of band cables having fasteners of mutually different shapes, there are cases where the difference in shape is easily distinguishable with the naked eye, but since the size of the fasteners is small in general, in most cases, it is not distinguishable with the naked eye. Therefore, in the case of a band cable used to bind the wires of the harness and secure a section of the harness at a position within a target apparatus, it is necessary to check if the band cable has a fastener of the specified shape intended for use at that position of the harness.

FIG. 1 shows a band cable checking instrument (BCCI) used for this purpose. The illustrated BCCI 10 is composed of a body 11 with a receiving well 12 formed at the top that is an opening space into which the fastener of a band cable can be inserted. Brackets are screwed to the front and rear sides of the body 11. When using the BCCI 10, the brackets are placed in the desired location on the workbench and screws are inserted into the screw holes formed in the brackets (p1) to securely fix it to the workbench.

In addition, the space of the receiving well 12 is shaped to fit a specific fastener to be inserted for inspection, and a push switch 13 is installed in a protruding state on the bottom of the space. And, both contact points of this switch are connected to terminals 1*a* and 1*b* installed through the bottom surface of the BCCI 10. To these terminals, wires 2*a* and 2*b* are connected, respectively, and the other ends of the wires 2*a* and 2*b* pass through a hole drilled in the workbench and are, under the workbench, connected to a POP (Point of Production) terminal installed at the harness manufacturing site and the like.

When checking whether a band cable intended for use in an arbitrary wiring harness is correct using the BCCI 10 shown in FIG. 1, a worker inserts the fastener of a band cable to be applied to the present wiring harness into the receiving well 12 of the BCCI 10 fixed at a predetermined location on the workbench.

At this time, when the shape of the fastener matches the receiving well 12, the fastener is inserted up to the bottom of the receiving well 12, and accordingly, the push switch 13 below is pressed, and both wires 2*a* and 2*b* are short-circuited with each other. This change in electrical state between the two wires 2*a* and 2*b* is detected by the POP terminal, and the band cable currently being inspected is judged to have passed.

In this specification, the fastener of a band cable to be inserted into the receiving well of the BCCI 10 for inspection is referred to as the 'test fastener'. And, when it is necessary to specifically distinguish a fastener, among the test fasteners, that has a shape that matches the structure of the receiving well of the BCCI, it is referred to as a 'matching fastener'. Likewise, a band cable with that fastener is referred to as 'test band cable' (TBC) or 'matching band cable' (MBC) if necessary.

If the test fastener of a band cable is a different type that does not match the shape of the receiving well 12, a part of the test fastener becomes caught at the entrance of the receiving well 12 and its end cannot reach the push switch 13. Therefore, since both contact points of the push switch 13 remain open, the POP terminal determines that the band cable is unsuitable.

However, as mentioned earlier, various types of band cables can be applied to the wiring harness. Therefore, if the harness a worker is working with changes, the BCCI that has a receiving well of a shape suitable for the fastener of the band cable determined to be applied to the harness must be set. This setting operation requires replacement of the BCCI, so that a considerable amount of time is used.

In the work of BCCI replacement, a worker first removes the screws inserted into the brackets fixing the BCCI to the workbench, then lifts the BCCI by hand and separate the wires 2*a* and 2*b* connected to the terminals 1*a* and 1*b* on the bottom of the BCCI. And, after reconnecting the wires to the terminals on the bottom of another BCCI to be newly used, the new BCCI is placed back on the workbench and fixed with screws. This replacement time is much longer than the time required to fasten the wiring harness with a band cable and then cut off a section of the band cable.

Since many band cables are applied to single harness, if multiple BCCIs need to be replaced, the replacement time becomes correspondingly longer. Moreover, after connecting the wires to the bottom of the BCCI to be used newly, when moving the BCCI to fix it on the workbench, the resulting fluctuation is transmitted to the wires newly connected to the bottom terminals, causing the wires to become disconnected. In this case, the replacement work time will be longer.

In addition to these problems, there is also a problem that occurs because the upper end of the push switch 13 installed on the bottom of the receiving well 12 of the BCCI shown in FIG. 1 has a predetermined area.

In case of different types of band cables that are somewhat different in the shape of the front end of the fastener, there may be cases where a fastener other than the matching fastener has an external shape that can be inserted into the receiving well 12. In those cases, there is a very high possibility that the push switch 13 will be pressed when such fastener is inserted into the receiving well 12 because the upper end of the push switch 13 has some width. That is, in addition to the matching fastener having the structure that exactly fits the shape of the receiving well 12 shown in FIG. 1, although a fastener does not exactly match the shape of the receiving well 12, it may be inserted into the receiving well 12 and press the push switch 13 if its size is relatively small compared to the matching fastener or if there is a partial difference from the matching fastener only in the shape of the front side which is the leading side based on the direction of insertion into the receiving well 12.

In this case, the POP terminal makes a pass judgment for the band cable of that fastener rather than the matching fastener. That is, even though it is not the type of band cable that should bind and be fixed to the corresponding position of the harness, it is not judged as a different type. Thus, the wiring harness bound by a band cable that was so misjudged is provided, as a properly manufactured harness, for application to the final apparatus. The harness provided in this way ultimately causes problems during the production process of the final apparatus like vehicle.

In conclusion, the BCCI equipped with the push switch 13 with a certain size of top area is provided in the receiving well 12 cannot accurately inspect the heterogeneity of the band cables, which may cause problems when installing the manufactured harness during the apparatus production process.

SUMMARY OF THE INVENTION

The purpose of the present invention is to provide a BCCI that allows easier setting for inspection according to the type of band cable.

Another object of the present invention is to provide a BCCI that allows accurate determination of heterogeneity even for test fasteners of various shapes.

Another object of the present invention is to provide a BCCI that allows easy replacement of parts that become defective due to external force applied during work.

Another object of the present invention is to provide a BCCI that allows changing the settings thereof for different types of test fasteners more easily and quickly.

Another object of the present invention is to provide a BCCI that that can be moved to and fixed at a position, with a simple work, beside the harness where a band cable is to be inspected for heterogeneity.

The scope of the present invention is not necessarily limited to the above explicit statements. Rather, the scope of the present invention covers anything to accomplish effects that could be derived from the specific and illustrative explanations of the present invention below.

An instrument for checking whether a band cable is heterogeneous, according to one aspect of the present invention, comprises: an anchor block configured to have a vertically penetrating a receiving tube into which a fastener attached to a band cable can be inserted when the fastener has a specific shape; a base platform configured to form a seating plane, on its upper surface, on which the anchor block is detachably mounted, to have a plurality of switches installed inside, each equipped with an up-down pin that can move up and down, so that they are spaced apart from each other by a certain distance and their up-down pins protrude above the seating plane by a predetermined height, and to have connection terminals on its outer surface that are electrically connected to each of the plurality of switches; and a latch plate configured to be capable of blocking at least a portion of upper side of the receiving tube.

In an embodiment according to the present invention, the receiving tube is formed in a structure different from the receiving tubes of one or more other anchor blocks, so that one or more band cable fasteners that can be respectively inserted into the receiving tubes of the one or more other anchor blocks are not inserted into the receiving tube.

In an embodiment according to the present, a plurality of vertically penetrating holes are formed in the anchor block, and screw holes are formed at a plurality of positions, on the seating plane, that are aligned with the holes when the anchor block is placed at a predetermined position on the seating plane.

In an embodiment according to the present, the base platform is configured to be stepped on both front and rear parts of the upper surface, a front lower stepped surface made due to the step forms the seating plane, a knob is mounted on a rear lower stepped surface made due to the step, and the latch plate having a length extending to a front border of the at least portion is coupled to upper side of the knob. Further, the knob is mounted to slide forward and backward along at least one axis inserted into a support wall formed between the front lower step surface and the rear lower step surface; an elastic member for accumulating elastic force during rearward slide of the knob is provided in the support wall or in the knob; the base platform is configured so that the knob has a slide operation distance to allow front end of the latch plate to be positioned further rearward than rear end of the seating plane; and a portion of a specific surface of the anchor block, which faces the support wall when the anchor block is mounted on the seating plane, is recessed inward to form a recess extending from top to bottom wherein the latch plate is configured to have a fore part that includes a portion that covers top of the recess when the knob is slid rearward by maximum operation distance, and to have a width narrower than a width of the recess, and a pillar, whose width matches the width of the recess, protrudes forward on the support wall.

In an embodiment according to the present, a through hole is formed in the latch plate; a screw hole is formed at top of the knob; the latch plate is fixedly coupled to the upper side of the knob by a single fastening means that is inserted into the through hole and screwed into the screw hole; and the fastening means has a handle on its upper portion that can be held and rotated by hand wherein a concavo-convex structure that can be fitted and assembled with each other is formed on both surfaces of the latch plate and the knob that face each other when they are coupled, In another embodiment according to the present, the latch plate is configured to include a fixed plate coupled to the knob, and a non-fixed plate assembled by being fitted with the fixed plate with one side partially facing one side of the fixed plate wherein the non-fixed plate can slide relative to the fixed plate in a state that it is assembled to the fixed plate.

In an embodiment according to the present, the knob is configured to form a fixing member at its top that opens in front of the knob and forms a tunnel therein with a predetermined length in a direction perpendicular to the opening direction on a horizontal plane; the latch plate is configured to have a guide bar formed at one end thereof, and to be assembled to the knob to enable relative sliding with respect to the knob by inserting the guide bar into the tunnel along its longitudinal direction; and the tunnel has a cross section that prevents the guide bar from rotating upward.

In an embodiment according to the present, a pair of axial walls, which are provided with opposing holes, are respectively formed on both sides of the upper side of the knob; the latch plate is configured to have a shaft rod at one end, and to be assembled to the knob in a state in which it can be rotated up and down around the shaft rod by inserting both ends of the shaft rod into the pair of opposing holes, respectively; and a locking member is installed, at top of at least one of the pair of axial walls, that can cover or open a portion of top of the latch plate through rotating around a vertical axis.

In an embodiment according to the present, at least a portion of the latch plate is configured to be moved in whole or in part relative to the base platform while being mounted on the instrument, thereby exposing entire upper surface of the anchor block. In the present invention, a fore part of the latch plate, which is within a predetermined length from front end, may be formed to have a relatively narrower width.

In an embodiment according to the present embodiment, the base platform is configured to be stepped on front part of its upper surface so that a lower stepped surface made due to the step forms the seating plane and a support wall is formed behind the seating plane, and to form a pair of axial walls, which are provided with a pair of holes facing each other, on both sides of top surface of the support wall wherein the latch plate is configured to have an axial rod at one end; both ends of the axial rod are respectively inserted into the pair of holes, so that the latch plate is assembled to the support wall in a state where it can rotate up and down with the axial rod as an axis; and a locking member is installed, at top of at least one of the pair of axial walls, that can cover or open a portion of top of the latch plate through rotating around a vertical axis. Further, in the present embodiment, a space is formed in at least one of the pair of axial walls from top thereof to a height lower than top of the support wall; a pivotable hook of a predetermined length is installed in the space so that it can rotate around a lower rotating axis in a direction toward the latch plate and in a reverse direction; the pivotable hook is configured to have a head with at least one side protruding perpendicularly to a longitudinal direction; an upper side of the head includes an inclined section whose height decreases toward a protruding end; and an elastic member is mounted between a first side of the pivotable hook facing in the reverse direction and a second side of the space facing the first side wherein the latch plate and the pivotable hook are configured and installed so that when the latch plate rotates downward around the axial rod, one side thereof abuts the inclined section of the pivotable hook.

In an embodiment according to the present, the instrument further comprises at least one ejector, whose length can vary in its longitudinal direction, that is installed, on an upper side of the support wall, with its longitudinal direction being vertical in such a manner that a top side of its part whose length does not change is no higher than a top side of the support wall. in the present embodiment, the ejector may comprise: a housing with an opening on one side; an elastic member mounted in the housing and having elastic force; and an actuator configured to protrude out of the housing through the opening when the compressed elastic member is extended by the elastic force.

In an embodiment according to the present, each of the plurality of switches includes a housing barrel into which the up-down pin is slidably inserted, and a connection ball, which is in contact with the housing barrel due to elastic force of an elastic member, forms part of an electrical connection between the switch and the connection terminal. In the present embodiment, a passage from the connection terminal to the switch, in which the connection ball is installed, may be formed in a structure such that only a part of the connection ball protrudes from the passage into a vertical hole that becomes empty when the switch is removed from the base platform.

In an embodiment according to the present, each of the plurality of switches includes a housing barrel into which the up-down pin is slidably inserted, and a movable rod that starts to move together when the up-down pin is inserted a predetermined distance or more into the housing barrel wherein the movable rod and the connection terminal are electrically connected.

In an embodiment according to the present, the instrument further comprises one or more guide station units on which the base platform can be detachably mounted wherein each of the one or more guide station units comprises a base panel having a predetermined width and a length longer than the width, and both side walls standing vertically on both sides of the base panel, and parallel to each other in a longitudinal direction of the base panel, and wherein rails are formed on opposing surfaces of the both side walls in the longitudinal direction, and at least one passage hole penetrating vertically to have a length longer than its width is formed in the base panel along the longitudinal direction. In the present embodiment, one and other ends of the base panel may be formed in a structure that can be engaged with each other, and locking holes may be formed continuously in the longitudinal direction in the guide station unit in order that a locking member capable of fixing the base platform to an arbitrary position, when the base platform is mounted to slide along the rails, is inserted into one of the locking holes. In addition, the instrument may further comprises a branch coupler, one end of which is formed in a structure capable of engaging with one end of the base panel, and other end of which is formed with a structure including a plurality of shapes, each forming a structure that can be engaged with one end of the base panel.

The present invention described above or an instrument for checking heterogeneity of band cables in accordance with at least one embodiment of the present invention to be described in detail below with reference to appended drawings is capable of significantly reducing the time required to set up a BCCI suitable for the fastener of a band cable, which is involved in inspecting the heterogeneity of various types of band cables that must bind the wiring harnesses. Also, by applying some embodiments of the present invention, that time can be further shortened, thereby increasing the productivity of harness manufacturing.

In addition, the BCCI according to the present invention can determine the heterogeneity of the band cable fastener more precisely because it determines the heterogeneity of the band cable fastener based on the difference in height at a plurality of points. Therefore, when the BCCI according to the present invention is applied, the possibility of distinguishing even small difference in shape between fasteners of different types of band cables increases. This reduces the number of cases where the BCCI must be manufactured to fit a new fastener shape, leading to a reduction in harness manufacturing costs.

Moreover, even when a new BCCI is needed to fit the shape of the fastener of a band cable newly used for a wiring harness, unlike in the prior art, only an anchor block with a structure to accommodate the fastener needs to be manufactured, which is also a factor that reduces costs compared to the prior art.

Additionally, in one embodiment according to the present invention, in the case of parts that cause problems in the up-and-down operation due to the force applied to the BCCI, the replacement of those parts can be done very simply. Accordingly, less time and cost are spent on maintenance of equipment or tools required for harness manufacturing.

In another embodiment according to the present invention, guide station units that can be linked to each other are provided, so that a plurality of BCCIs can be moved, while being guided by a series of guide station units fixed to the workbench, and then fixed at desired positions respectively. That is, the BCCIs can be moved to desired positions very simply by these guide station units. Therefore, when the harness to work on is changed, the setting time to replace or reposition the BCCIs to fit the new harness, that is, the time to prepare for the actual work of binding a harness with band cables, as well as checking whether the band cables are of a different type, is significantly reduced compared to the prior art.

In addition, the guide station units presented according to an embodiment of the present invention can be assembled with their longitudinal directions intersecting each other. Thus, even if work has to be done on a wiring harness in a curved shape in some sections thereof due to the work environment, the guide rails for the BCCIs can be installed according to the curved shape and the BCCIs can be individually fixed on the installed guide rails.

DETAILED DESCRIPTION

Figure 1:
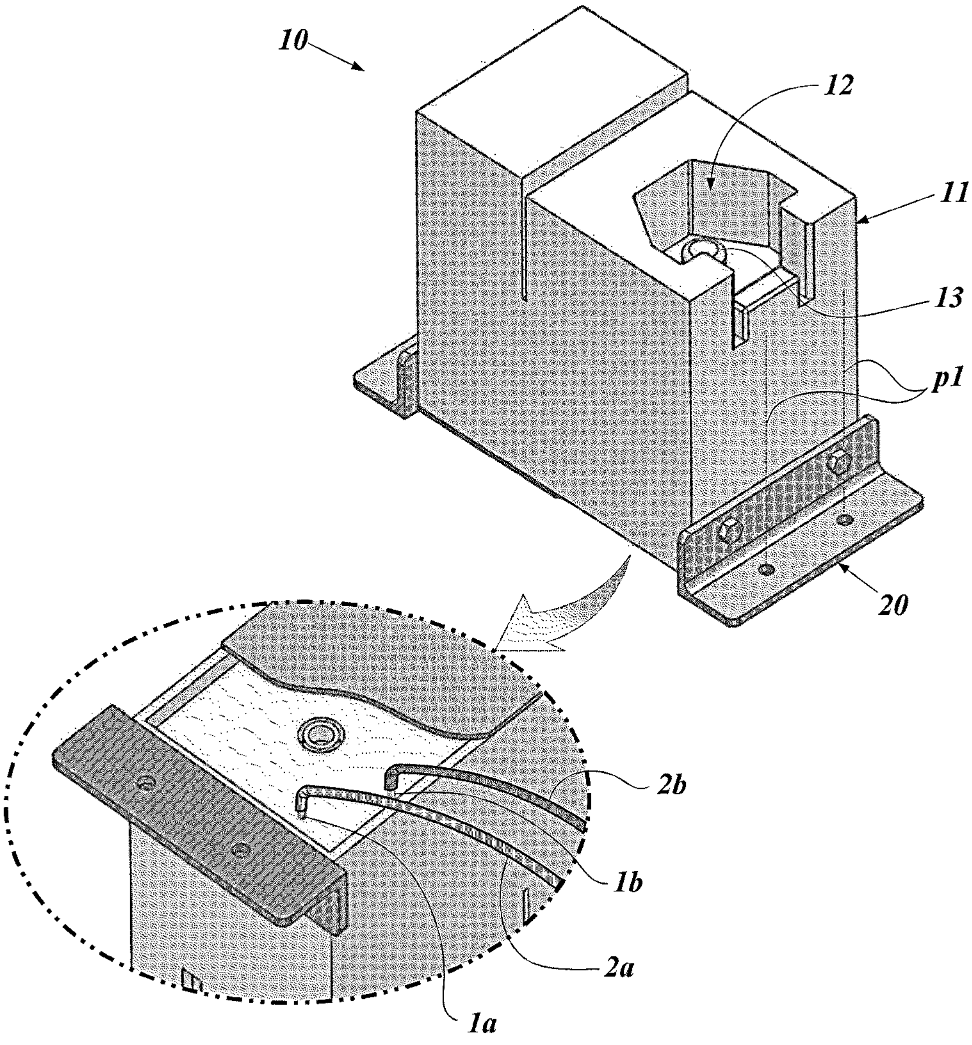
FIG. 1 shows a BCCI used to check whether the band cable to bind the wiring harness is of a specified type.

In what follows, embodiments of the present invention will be described in detail with reference to appended drawings.

In the following description of the embodiments of the present invention and the accompanying drawings, the same reference numerals or symbols designate the same elements unless otherwise specified. Of course, for convenience of explanation and for the sake of understanding, the same components may be indicated by different reference numbers or symbols if necessary.

Figure 2A:
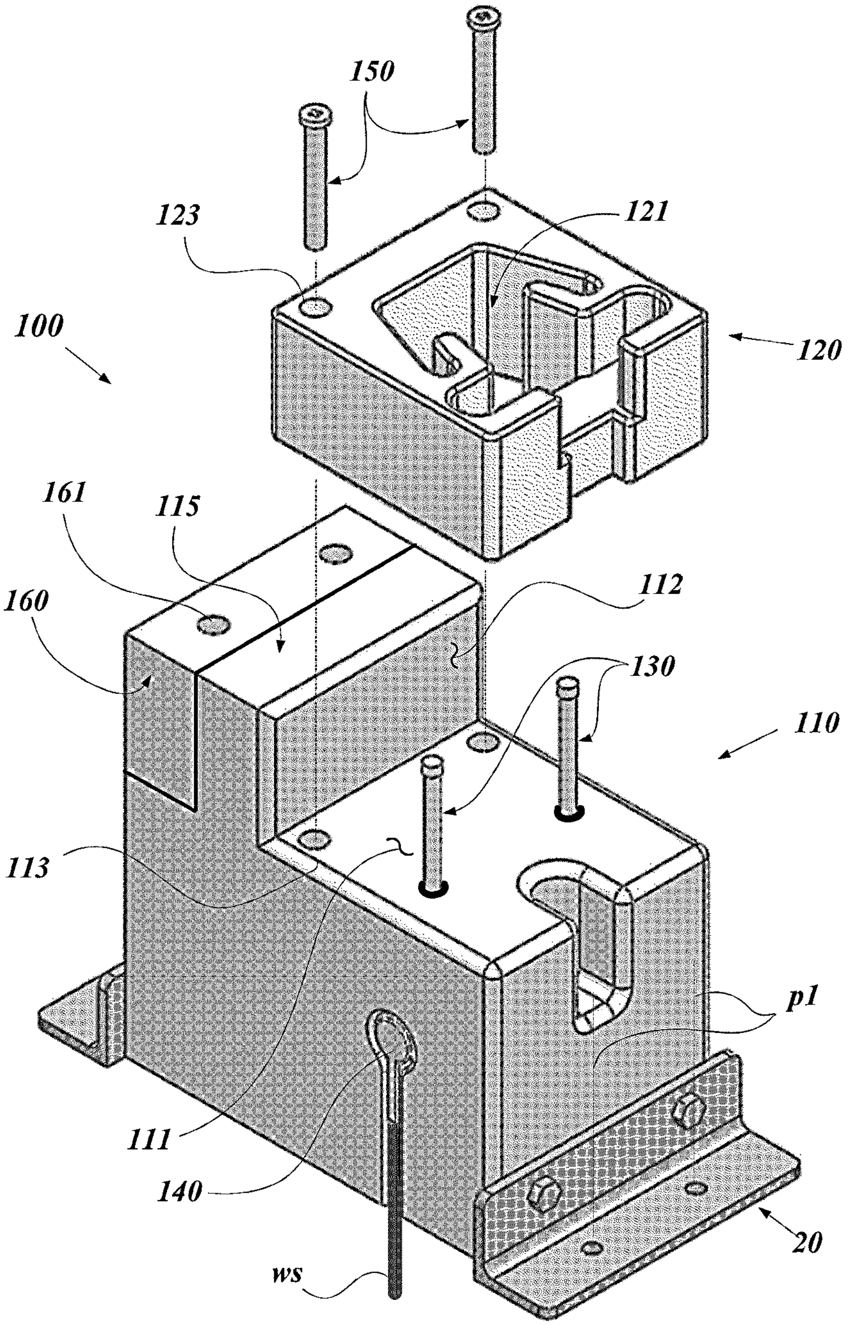
FIGS. 2A and 2B show the configuration of an instrument for checking whether a band cable is of a different type, according to an embodiment of the present invention.
Figure 2B:
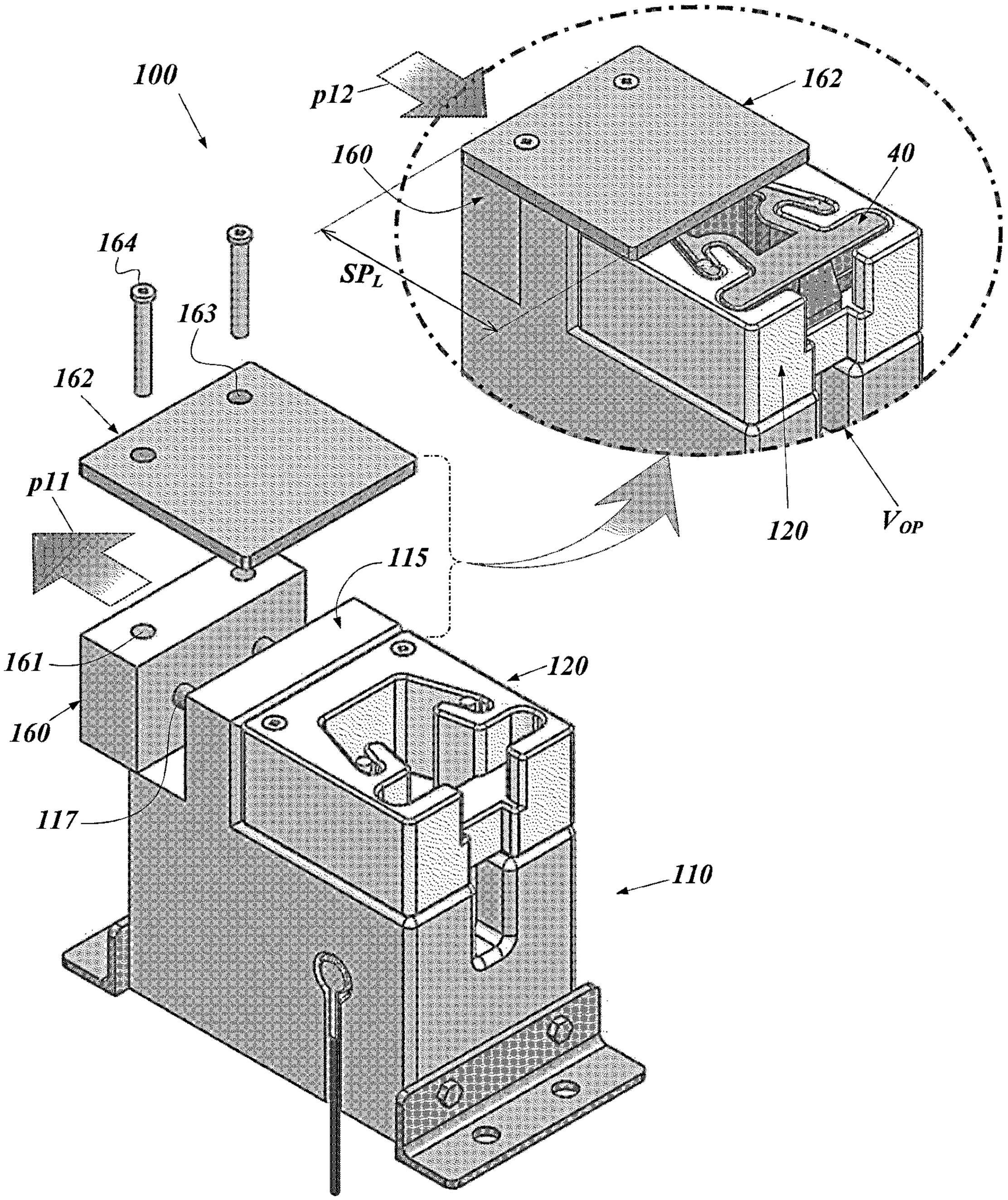

FIGS. 2A and 2B show the configuration of a BCCI for checking whether a band cable is of a different type, according to an embodiment of the present invention.

The BCCI 100 for checking the heterogeneity of a band cable according to the present invention comprises, as components thereof: an approximately hexahedral anchor block 120 with a receiving tube 121, which is a hole penetrated vertically in a shape suitable for the shape of a certain type of band cable fastener (also called an 'anchor') to be tested, formed in the central portion; and a base platform 110 in which a step corresponding to the height of the anchor block 120 is formed at the front and rear of the upper portion.

A knob attached to a stopper is installed in the space formed by the rear step of the base platform 110. FIG. 2B is a perspective view of the BCCI 100 in more detail including all the structural members of the stopper, showing that the stopper is composed of a knob 160 and a latch plate 162.

The knob 160 is mounted to slide back and forth along a pair of slide rods 117 installed on a support wall 117, and when the knob 160 is pulled rearward (p11), elastic force is accumulated in an elastic member inserted between the end of the slide rods and the inner surface of the knob 160. When the pulling force disappears, the knob 160 returns to its original position (p12) due to the elastic force. The elastic member may be mounted in the hole of the support wall 117 into which the slide rods 117 are inserted. In this case, the slide rods 117 move together with the knob 160.

Screw holes 161 are formed at the top of the knob 160, and a latch plate 162 is secured by bolts 164 inserted into the screw holes 161 through holes 163 of the latch plate 162. The latch plate 162 has a stopping length ($SP_L$) that can cover the rear portion of the receiving tube 121 of an anchor block 120 when the knob 160 is in the original position ($V_{OP}$). Therefore, when the knob 160 is in the original position, the latch plate 162 blocks, at the top of the fastener, a portion of the fastener 40 of a band cable which has been inserted into the receiving tube 121 of the anchor block 120.

The term 'stopping length' used in this specification refers to the length that the latch plate can cover up to a predetermined position with respect to the anchor block 120. Therefore, depending on where the rear end of the latch plate 162 is located on the top of the knob 160, the length indicated by the term 'stopping length' may vary.

The anchor block 120 is guided downward while in contact with the support wall surface 112 and seated onto the front step plane 111 (hereinafter referred to as 'seating plane') below the top of the base platform 110. Screw holes 113 are formed at two or more locations on the seating plane 111 adjacent to the supporting wall surface 112. The locations at which they are formed are, as shown, the spots where the coupling holes 123 penetrating the anchor block 120 in the vertical direction are located respectively when the anchor block 120 is exactly placed at the predetermined position on the seating plane 111.

When checking whether the band cable is of a different type or not, with the anchor block 120 placed on the seating plane 111, a worker inserts tightening screws 150 into each of the coupling holes 123 of the anchor block 120 to strongly secure the anchor block 120 to the base platform 110.

On the seating plane 111, two or more pin switches 130 are installed at a predetermined distance apart from each in a manner that they can be moved up and down, respectively, and each of the installation positions is the spot that belongs to a zone to be penetrated vertically in common or to be blocked vertically in some anchor blocks when a plurality of anchor blocks including the anchor block 120 are placed on the seating plane 111.

On both sides of the base platform 110, connection terminals 140 are electrically connected to the pin switches 130 installed on the base platform 110. Grooves are formed at both sides respectively to guide the wire (ws) from the bottom to the connection terminals 140, and some of the wires for electrical connection to a POP terminal, which is a computing device, are connected to the connection terminals 140 along the grooves.

Brackets 20 are screwed to the front and rear sides of the base platform 110, similar to the conventional BCCI 10. A worker inserts screws (p1) into screw holes of each of the brackets 20 and fixes the BCCI 100 at the desired location on the workbench.

Figure 3:
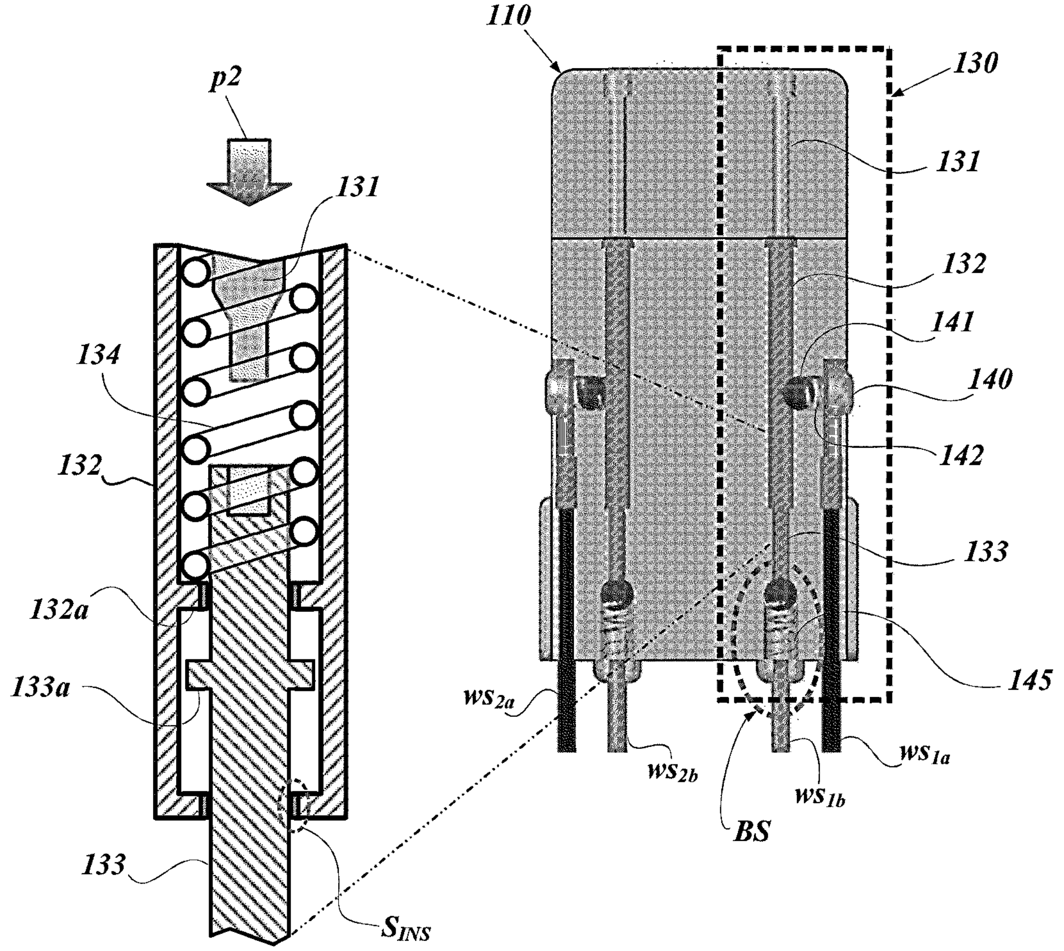
FIG. 3 is a diagram showing the connection relationship between wires to the pin switches and the operation mechanism of the pin switch provided to be raised and lowered within the instrument of FIG. 2.

As described above, wires extending from the POP terminal are connected to each of the pin switches 130. FIG. 3 is a diagram showing the connection relationship between wires to the pin switches and the operation mechanism of the pin switch, with the base platform 110 cut vertically along the inner plane on which both pin switches are installed.

The pin switch 130 consists of: a housing barrel 132 that is inserted and fixed into a hole of the base platform 110 vertically penetrating the seating plane 111; an up-down pin 131 that moves upward and downward within the housing barrel 132 by pressing force and elastic force; a movable rod 133, mounted below the up-down pin 131 within the housing barrel 132, that moves upward and downward by pressing force and elastic force in the same way as the up-down pin 131; and a spring 134 installed in the space between the inner peripheral surface of the housing barrel 132 and the outer peripheral surface of the up-down pin 131.

The hole into which the pin switch 130 is inserted and installed has a depth that allows the up-down pin 131 to protrude above the seating plane 111 by a predetermined height or more when the pin switch 130 is installed in that hole. Here, the predetermined height may be approximately ½ of the height of the anchor block 120.

In a state in which no pressing force is applied to the up-down pin 131, the lower end of the spring 134 is in contact with the fixing stage 132*a* provided in the housing barrel 132, and its upper end is in contact with the ring (not shown) formed to protrude radially from the outer peripheral surface of the up-down pin 131. When the up-down pin 131 is pressed, elastic force is accumulated as the spring 134 is compressed by the descending ring, and when the pressing force is released, the up-down pin 131 is pushed up by the accumulated elastic force and returned to its original position.

The housing barrel 132 and the movable rod 133 are made of a conductive material or a conductive material is applied to the outer surface. Insulating film ($S_{INS}$) for electrical insulation are filled between the outer peripheral surface of the movable rod 133 that moves up and down and the internal structure of the housing barrel 132 to come into contact with the rod. Therefore, as shown in FIG. 3, in a state where no force is applied to the top side of the movable rod 133, that is, a spring within the connection terminal (BS) installed upward from the bottom of the base platform 110 is pushing the movable rod 133 upward, the housing barrel 132 and the movable rod 133 are electrically disconnected from each other.

If a pressing force is applied to the head of the up-down pin 131 to move downward (p2), the movable rod 133 also descends together after the bottom end of the up-down pin contacts the upper end of the movable rod 133. When a flange 133*a* protruding from the outer peripheral surface of the movable rod 133 is moved down up to the bottom wall of the housing barrel 132, the descent is stopped. While the movable rod 133 is moving downward, the spring 145 within the connection terminal (BS) is compressed.

The outer peripheral surface of the housing barrel 132 and the connection terminal 140 provided on either side of the base platform 110 are electrically connected by a conductive connection ball 141 and a connection spring 142. Since the connection spring 142 is installed in the connection terminal on the side in a compressed state, its elastic force brings the connection ball 141 into close contact with the housing barrel 132, thereby maintaining the electrical connection between the side connection terminal 140 and the housing barrel 132. This is the same even in the case of the bottom connection terminal (BS) of the base platform 110.

As described above, since the housing barrel 132 and the movable rod 133 are made of a conductive material, when the flange 133*a* is in contact with the bottom wall of the housing barrel 132, they are electrically short-circuited with each other. At this time, the side connection terminal 140 is electrically connected to the connection spring 142, the connection ball 141, the housing barrel 132, the movable rod 133, and the connection terminal (BS) at the bottom.

Accordingly, a pair of wires $ws_{1a}$ and $ws_{1b}$ extending from the POP terminal and connected to both ends of the pin switch 130 are electrically connected to each other. When the pair of wires $ws_{1a}$ and $ws_{1b}$ change from being open to being short-circuited, the POP terminal detects that state change and determines that the corresponding pin switch 130 of the BCCI 100 has been pressed.

When the force applied to the up-down pin 131 is released, the up-down pin 131 rises due to the elastic force of the spring 134, and at the same time, the movable rod 133 also rises within its operating range, returning to its initial position before force was applied.

The operation of the pin switch 130 and the resulting change in electrical connection relationship described above are equally applied to both pin switches 130 installed on the base platform 110. In the embodiment presented to specifically explain the technical principles and ideas of the present invention, two pin switches 130 are installed in the base platform 110 as an example. However, without being limited to this example, the BCCI may be configured by installing more pin switches in the base platform according to other embodiments of the present invention. Even in the configuration of such embodiments, the technical principles and ideas of the present invention can be embodied. In case that three or more pin switches are installed in the base platform, each pin switch may be installed in the base platform in a manner that the above description is applied as it is.

When implementing the BCCI by installing three or more pin switches in the base platform, each installation position is appropriately determined on the seating plane 111 in compliance with the basic principles described in detail below using two pin switches as an example.

Hereinafter, a method of inspecting various types of band cables for heterogeneity using the BCCI 100 will be described in detail with reference to FIG. 4.

First, a worker determines a location on the workbench corresponding to a position where MBCs should be placed to bind the harness mounted on a series of U-shaped stands on the workbench 30, drills a hole 31 at that location for the passage of wires to be connected to the POP terminal, and passes the wires connected to the POP terminal through the passage hole 31 to connect them to connection terminals provided on the bottom and sides of the base platform 110 of the BCCI 100, respectively. After the electrical connection being completed, the base platform 110 is fixed to the determined location on the workbench 30. The fixing method at this time is the same as that for the conventional BCCI 10.

After the base platform 110 is fixed, the anchor block 120 having a receiving tube 121 of a structure suitable for the fastener shape of the MBC to be applied to the harness at that location is selected, and is strongly fixed onto the seating plane 111 of the fixed base platform 110 using tightening screws 150. Then, the latch plate 162 is coupled to the top of the knob 160 using the bolts 164.

After the BCCI 100 is fixed on the workbench 30 in this way, in a state in which the MBC determined for the corresponding position of the harness can be inspected, the fastener 40 of a TBC to tie the harness at that position is inserted into the receiving tube 121 of the anchor block 120 (p3). In FIG. 4, the latch plate is not shown, and only the fastener 40 is shown with respect to a TBC.

When a worker inserts the fastener, that is, the anchor 40, into the anchor block 120, the knob 160 is pulled rearward to completely uncover the rear of the receiving tube 121 blocked by the latch plate 162. When the fastener is completely inserted into the receiving tube 121, the knob 160 is released to return to its original position ($V_{OP}$), so that the latch plate 162 blocks the rear portion of the fastener.

Figure 5:
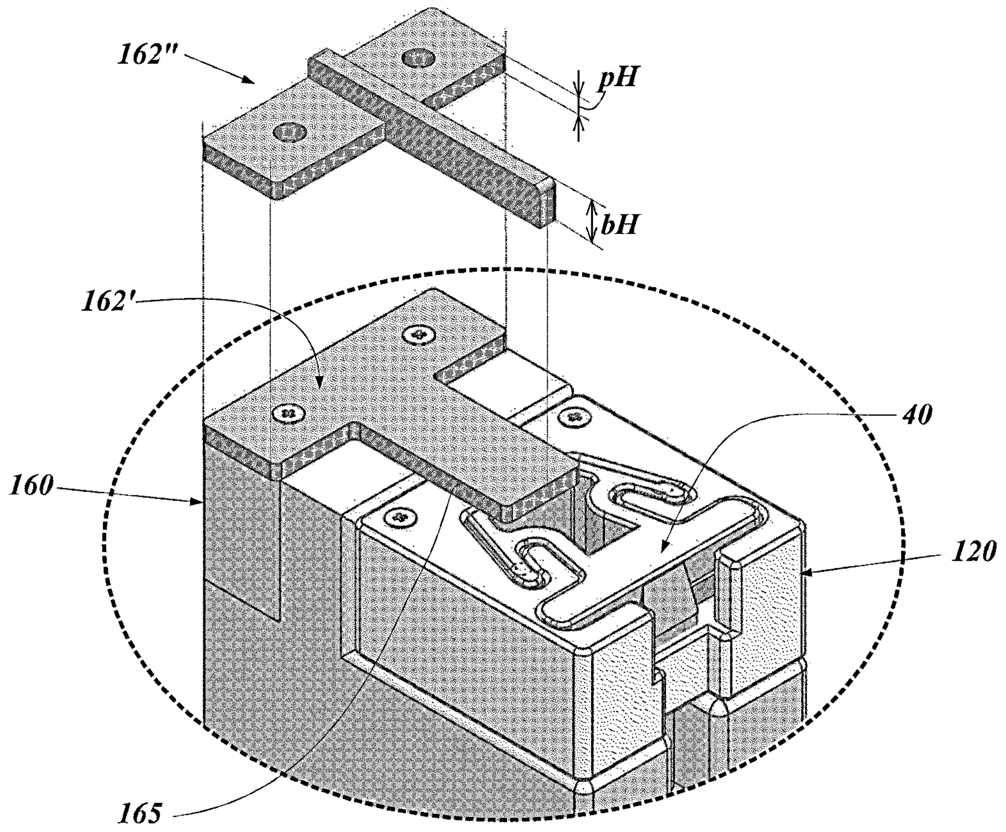
FIG. 5 is a perspective view showing the upper part of the base platform to which a latch plate of a different type than the latch plate of the instrument illustrated in FIG. 2 is applied.

The latch plate 162, which functions as a practical stopper, does not need to have a square shape. Since the latch plate needs only to block the rear portion of the fastener when the knob 160 returns to its original position, it may have a shape that covers a portion of only the rear center area instead of the entire rear of the anchor block. FIG. 5 shows a latch plate 162', for example in the shape of a letter 'T', having a latch strip 165 having a narrower width than the rear end, configured according to another embodiment meeting such requirements. In FIG. 5, the BCCI is partially shown with the anchor block 120 coupled to the knob 160 mounted thereon.

In addition, as shown in FIG. 5, the latch plate 162" may be configured so that the portion covering the center of an anchor block has a beam shape with a narrower width than the latch strip 165. As shown, since the central part of this beam shape has a height (bH) greater than the thickness (pH) of the plate part coupled to the knob 160, it is sufficiently resistant to the upward force to be repeatedly applied to the fasteners inserted into the anchor block by a worker in the work of binding the harness with the band cable, which will be described later.

Figure 4:
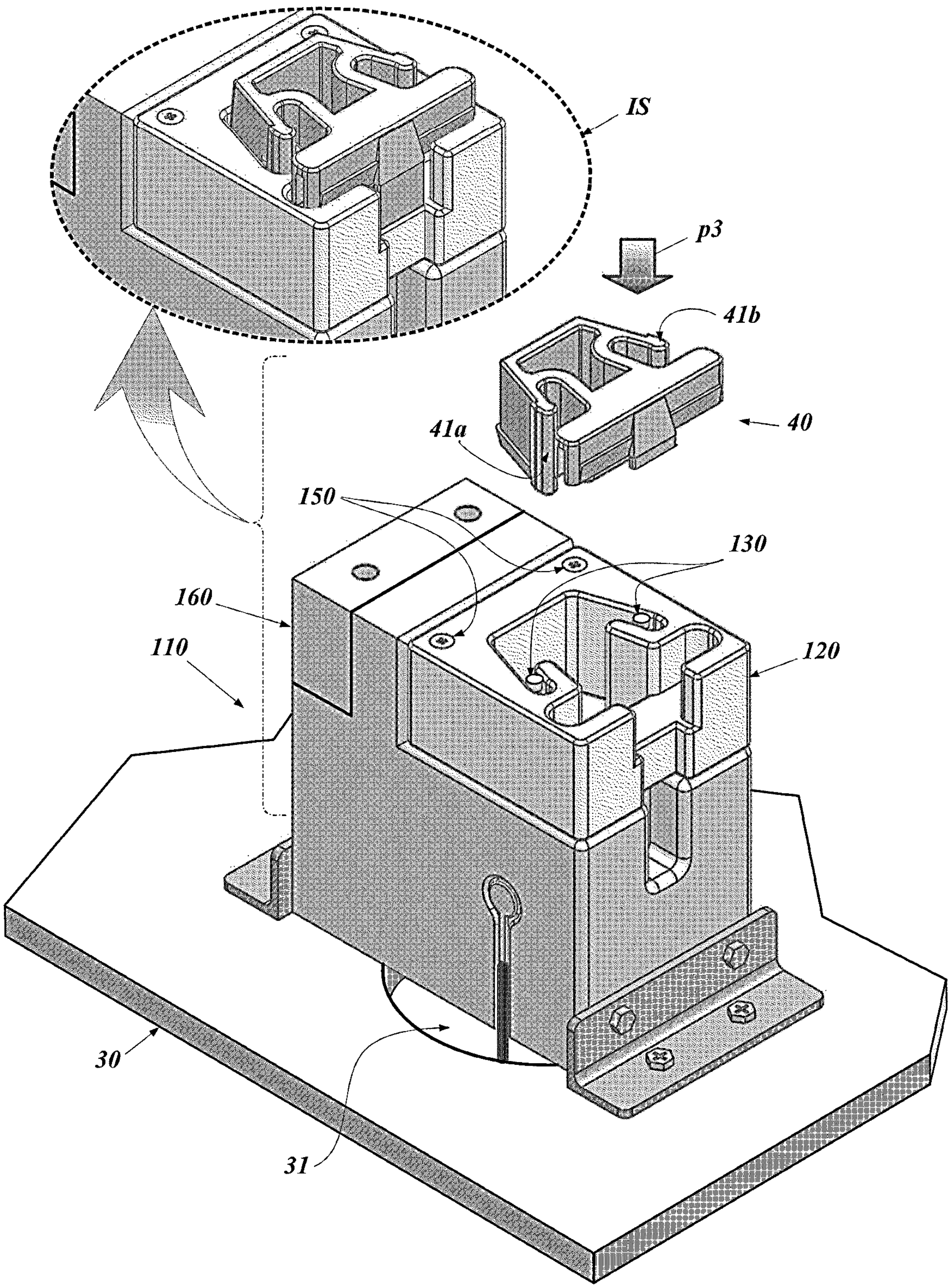
FIG. 4 is a diagram illustrating how the inspection of whether a band cable is of a different type is performed in the instrument of FIG. 2.

In the above process of inserting the fastener, when the fastener 40 to be inserted into the receiving tube 121 of the anchor block is the matching fastener, as partially shown (IS) in FIG. 4, as the fastener 40 enters the receiving tube 121 completely, the up-down pins 131 that have risen to the entrance of the receiving tube 121 are pushed downward by the fastener 40. In the example of FIG. 4, the positions of the up-down pins 131 on the seating plane 111 correspond to the positions of the leaves 41*a* and 41*b*, respectively, on both sides of the matching fastener 40 (if it is fully inserted into the receiving tube 121), so that both leaves 41*a* and 41*b* push the up-down pins 131 downward together.

Then, as described above, the descending up-down pin 131 pushes the movable rod 133 below it, and accordingly, the corresponding pin switch electrically short-circuits the two connection terminals, namely both the side connection terminal 140 and the bottom connection terminal (BS). The change from the open state to the short state of both connection terminals is transmitted to the POP terminal, which is a computing device, through the connected wires $ws_{1a}$ and $ws_{1b}$ (i=1, 2, . . . ), information indicating 'pass' for the current TBC is displayed by the POP terminal to notify a worker that it is an MBC, and at the same time, the fact that the TBC in the current order has passed is recorded in an inspection history table.

The passing condition for the TBCs is set in advance in the POP terminal by a worker. That is, it is set that both pin switches must be turned on, as the condition for passing the TBCs that will be inspected for heterogeneity in the BCCI 100 fixed at a specific location beside the wiring harnesses on the workbench.

If the TBC is an MBC, it is sufficiently inserted into the receiving tube 121 of the anchor block 120, so that the latch plate 162, which returns to its original position, passes the boundary of the fastener 40 without being caught thereby and blocks a portion of the fastener 40 ($V_{OP}$). Then, a worker strongly pulls the strip-shaped band of the band cable through a through hole formed in the body thereof to which the fastener 40 is connected, so that the band cable binds the harness. Finally, a worker locks the binding state and cuts the band leaving an appropriate length in the part of the band that has passed through the through hole. As a result, the binding work for the corresponding position of the harness using the MBC is completed along with the inspection on whether the MBC applied at the corresponding position of the harness is heterogeneous or not.

If the TBC inserted into the anchor block 120 is not an MBC, the shape of the fastener 40 does not match the structure of the receiving tube 121 of the anchor block 120, and the fastener 40 cannot be inserted into the receiving tube 121 of the anchor block. In this case, immediately recognizing that the TBC is not of the type designated to be applied to the corresponding position of the harness, a worker replaces the TBC.

If the shape of a TBC is similar to that of the MBC or its size is smaller than the MBC, its fastener may be inserted into the receiving tube 121 of the anchor block 120. Even if this case occurs, there is little possibility that the fastener will press both up-down pins 131 at the same time. This is based on the following reasons.

Figure 6:
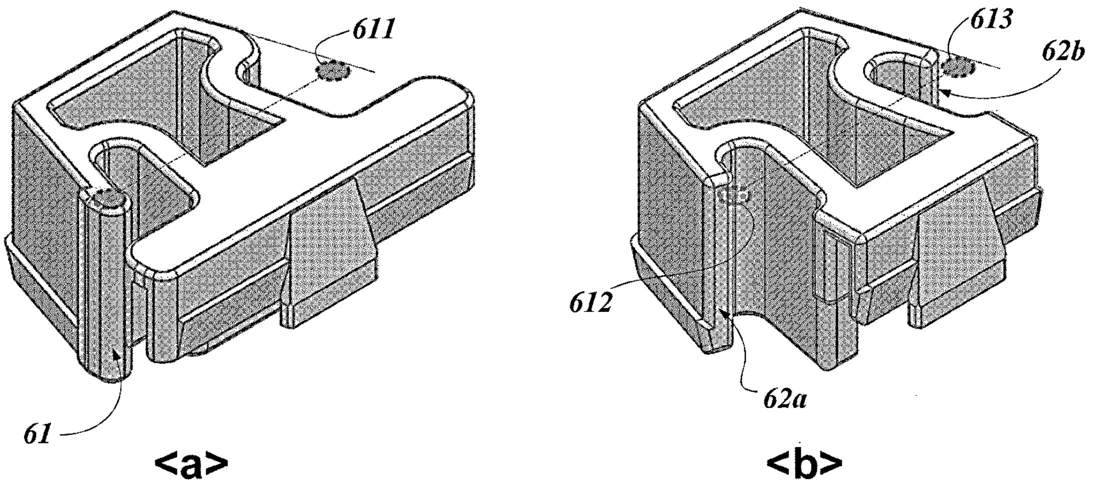
FIG. 6 is an example showing that even fasteners of band cables with similar shapes can be distinguished from each other as heterogeneous by the instrument constructed according to an embodiment of the present invention.

FIG. 6 shows examples of the shape of the fastener in which the combination of whether or not both up-down pins 131 installed in the BCCI are pressed is different, assuming the anchor block 120 of the structure illustrated in the previous drawing.

Both fasteners <a> and <b> illustrated in FIG. 6 are shaped to be inserted into the receiving tube 121 of the anchor block 120 illustrated in FIG. 4, but the fastener <a> is of a type that cannot press one of the two up-down pins 131 on the seating plane 111 (611) because it has one leaf 61. Although fastener <b> has both leaves 62*a* and 62*b*, it cannot press both up-down pins 612 and 613 because the length of the leaves is relatively short. Therefore, whether they are of different types each other can be determined by the combination of ON/OFF of both pin switches 130.

The shape/structure of the anchor blocks and fasteners illustrated in the drawings of this specification is nothing more than simple examples presented for specific description of the embodiments, and there are many different shapes of the band cable fasteners and the corresponding structures of the receiving tubes formed in the anchor blocks. However, the types of band cables specified for use in the wiring harness applied to a particular target device are limited to a certain number. Thus, in manufacturing the base platform 110 of the BCCI 100 embodied according to the technical principles and concepts of the present invention, the number of pin switches 130 and the installation positions of the pin switches 130 are determined, so that the principle presented through an example in FIG. 6 can be applied as is, in such a way that the combinations of similar fastener shapes of the limited number of types of band cables to press the plurality of up-down pins 131 are different each other.

Therefore, the types of band cables applied to the harness, each fastener of which can be inserted into the receiving tube of single anchor block, can be all distinguished from each other by the ON/OFF combination of pin switches installed in the BCCI constructed according to the present invention.

If there are different types of fasteners that have similar shapes so that the combination of pressing the pin switches is the same, an anchor block with the structure, which makes a difference in whether or not they can be inserted into its receiving tube depending on their distinct or small shape differences, is newly manufactured and used for the heterogeneity test.

Meanwhile, when the binding of the MBC to the harness is completed as described above, a worker pulls the knob 160 backward (p11) to completely open the upper side of the fastener, which is partially blocked by the latch plate 162. Next, by pulling the MBC, the fastener 40 is pulled out from the receiving tube 121 of the anchor block.

Figure 7:
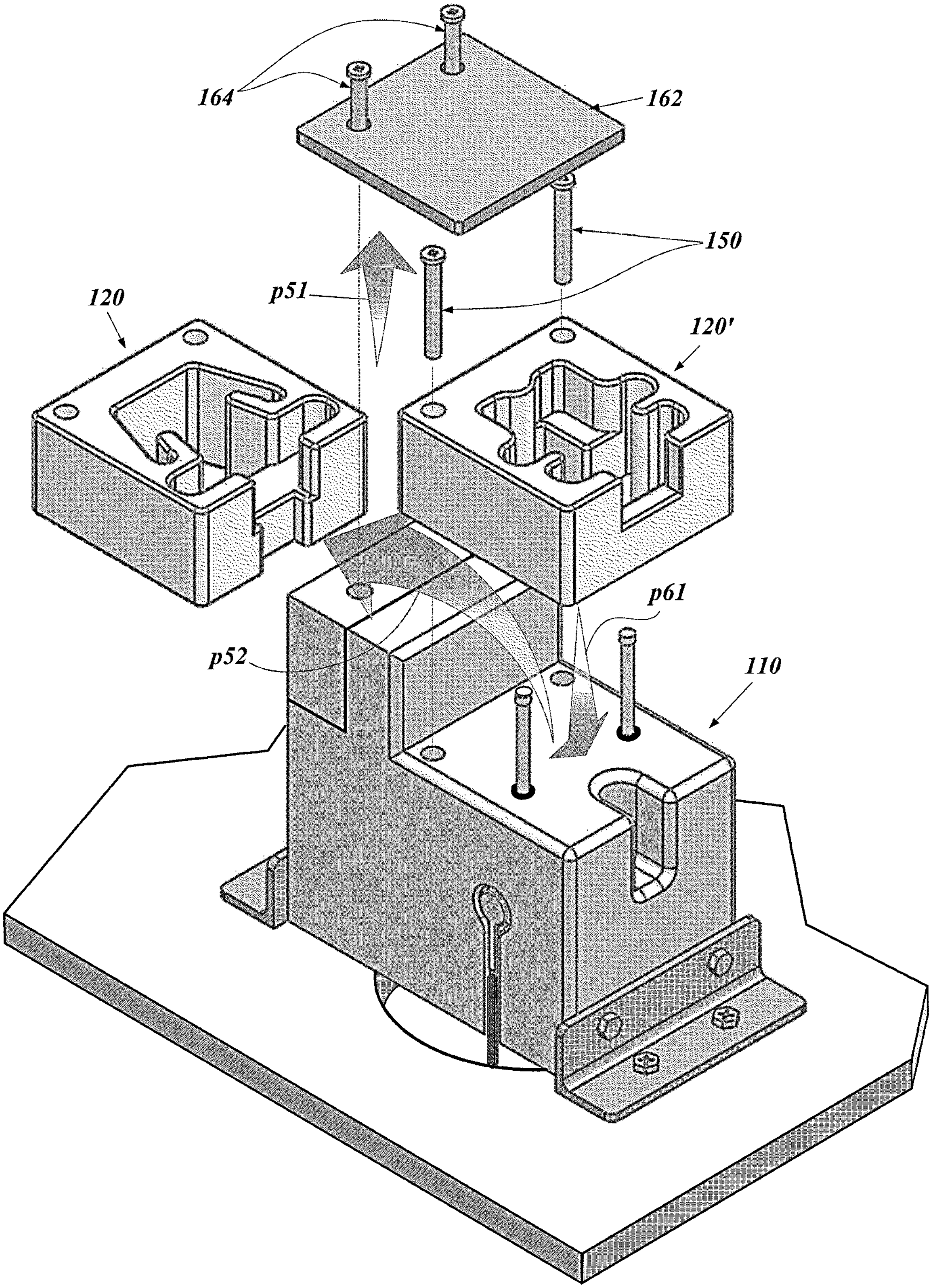
FIG. 7 is a diagram showing that the instrument according to the present invention is set to match the type of a band cable applied to a wiring harness.

When the above-described work using the BCCI 100 is required for other type of band cables to be applied to the wiring harness, a worker unfastens the bolts 164 and removes the latch plate 162 coupled to the knob 160 (p51) first, as illustrated in FIG. 7, lifts the anchor block 120 vertically to separate from the seating plane 111 (p52) after releasing the tightening screws 150 that currently secures the anchor block 120 to the base platform 110, and accurately places another anchor block 120' with a structure, which matches the fastener shape of the other type of MBC that needs to be inspected newly, on the empty seating plane 111 (p61) and then fastens it with tightening screws 150.

In the previous embodiment, the bolts 164 fastening the latch plate 162 are first loosened, the latch plate 162 partially blocking the top of the anchor block is removed, and then the mounted anchor block is removed. However, the removing the latch plate is not an essential matter for practicing the present invention, and the base platform of the BCCI 100 is provided so that the mounted anchor block can be replaced without the process of removing the latch plate 162 from the knob 160. These embodiments will be described in detail below.

Figure 8:
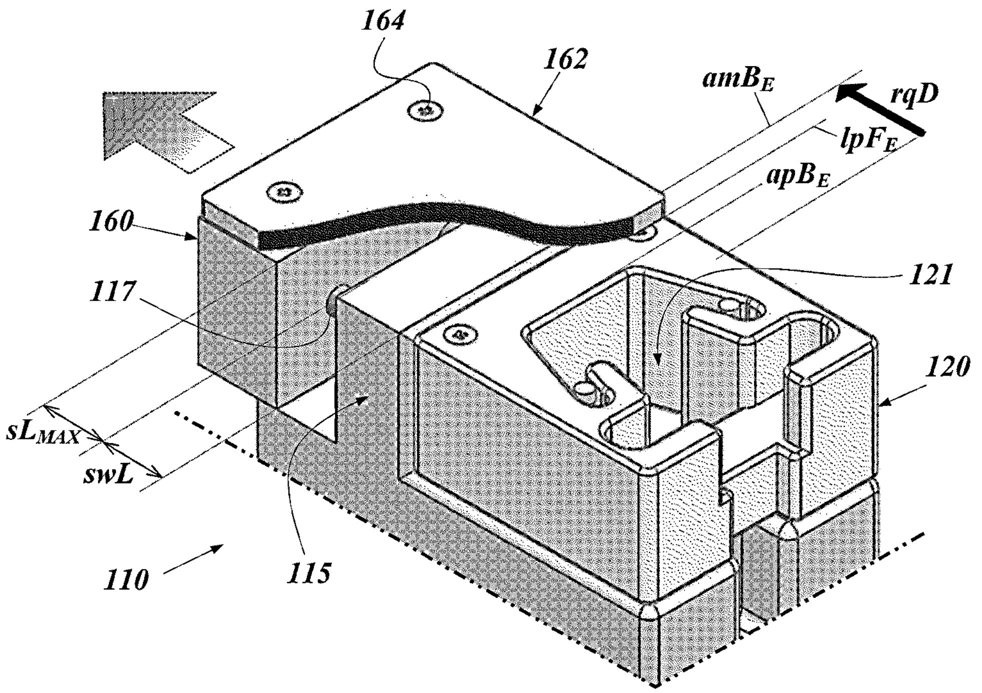
FIG. 8 shows the instrument of FIG. 2 with the latch plate partially cut away, showing only the upper part thereof.

FIG. 8 is a perspective view of the BCCI 100 of FIG. 2 showing only the upper part with the latch plate 162 partially cut away and the knob 160 moved rearward.

The previously described embodiment is the case where the base platform is configured such that the front end ($lpF_E$) of the latch plate 162 is located further back than the boundary ($apB_E$) of the receiving tube 121 of the anchor block 120, but further forward than the rear wall ($amB_E$) of the anchor block 120, when the knob 160 is moved rearward by the maximum operating distance ($sL_{MAX}$).

Therefore, if the base platform is configured so that the maximum operating distance ($sL_{MAX}$) of the knob 160 is longer than the opening-required distance (rqD), which means the distance from the front end of the latch plate 162 to the boundary ($apB_E$) when the knob 160 is in the original position, the front end of the latch plate 162 is located at the top of the support wall 115 not to block any part of the top of the currently mounted anchor block 120, when a worker pulls the knob 160 backward to the maximum. That is, the upper side of the anchor block 120 is completely exposed upward. Therefore, the mounted anchor block can be removed immediately without first removing the latch plate 162.

The maximum operating distance ($sL_{MAX}$) of the knob 160, in the case of the stopper configured so that the slide rods 117 move together with the knob 160, depends on the thickness (swL) of the support wall 115 that accommodates the slide rods 117 of the knob 160. Therefore, if the thickness (swL) of the support wall is made thicker than that illustrated in FIG. 8 (That is, if the dimension satisfies swL>rqD), the maximum operating distance of the knob 160 can be made longer than the opening-required distance (rqD).

In other embodiments according to the present invention, even if the maximum operating distance of the knob 160 is shorter than the opening-required distance (rqD), the anchor block can be immediately separated without removal of the latch plate by unfastening the bolts (164). According to the present embodiments, there is no need to further increase the thickness (swL) of the support wall 115, so that the base platform can be further miniaturized compared to the embodiment in which the maximum operating distance of the knob is longer than the opening-required distance (rqD).

Figure 9:
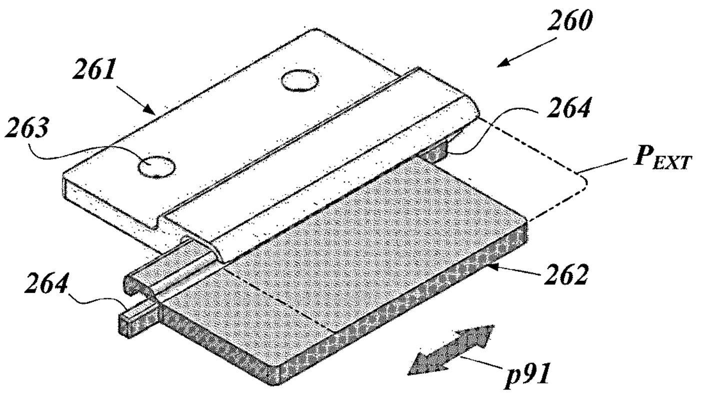
FIG. 9 shows the configuration of a latch plate according to another embodiment of the present invention.
Figure 9:
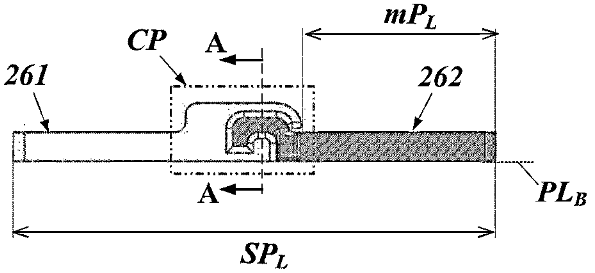
Figure 9:
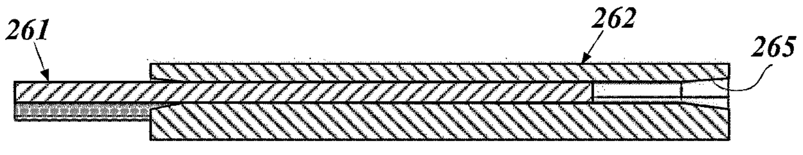

FIG. 9 illustrates the configuration of one of the latch plates in the present embodiments and shows that the latch plate 260 is composed of a fixing plate 261 and a slide plate 262.

The fixed plate 261 and the slide plate 262 are manufactured so that the distance between the rear end of the fixed plate 261 and the front end of the slide plate 262 in the assembled state is adjusted to the above-explained stopping length ($SP_L$) and at the same time has a dimension longer than the opening-required distance (rqD).

The fixing plate 261 and the slide plate 262 have an interlock part formed at one end (CP) bent into a hook shape with a structure that can be engaged with each other, and are assembled by inserting the interlock parts into each other (CP) with their sides facing each other. The structure of this interlock part, as shown in the side view of <b>, allows one to be assembled so that one cannot move up or down with respect to the other, and the bottom surfaces of each other are on the same plane ($PL_B$).

As in the previous embodiment, the fixing plate 261 is coupled and fixed to the knob by fastening the bolts 164 inserted into the through holes 263 to the knob 160. The slide plate 262 assembled to the fixing plate 261 by the interlock parts is not fixed to the knob 160, and is therefore in a state in which it can slide (p91) to both sides.

In order to facilitate the assembly of the fixing plate 261 and the slide plate 262 through the interlock parts, the interlock part accommodating the other has a structure 265 that becomes wider toward the inlet, as shown in the cross-sectional view of <c>. The interlock part to be accommodated into the other may have a tapering structure.

A push protrusion 264 is formed on at least one side of the slide plate 262. This push protrusion 264 has a height that protrudes further than the same side of the fixing plate 261 when the slide plate 262 is positioned ($P_{EXT}$) at the center of the fixing plate 261. More specifically, it has a height that protrudes more laterally than the side of the support wall 115 located below it when the latch plate 260 is coupled onto the base platform.

In the embodiment in which the latch plate 260 configured as illustrated in FIG. 9 is applied to the base platform, the slide plate 270 is separated from the fixing plate 261 by pressing the push protrusion 264 to slide the slide plate 270 to one side when a worker wants to replace the mounted anchor block. Then, the entire upper surface of the anchor block is exposed upward and the top side is completely open, so that the anchor block can be unfastened and removed from the base platform as described above.

Therefore, in the embodiment in which the latch plate 260 of FIG. 9 is applied, the anchor block can be more easily removed without unfastening the bolts 164 that combine the fixing plate 261 to the knob 160.

Figure 10:
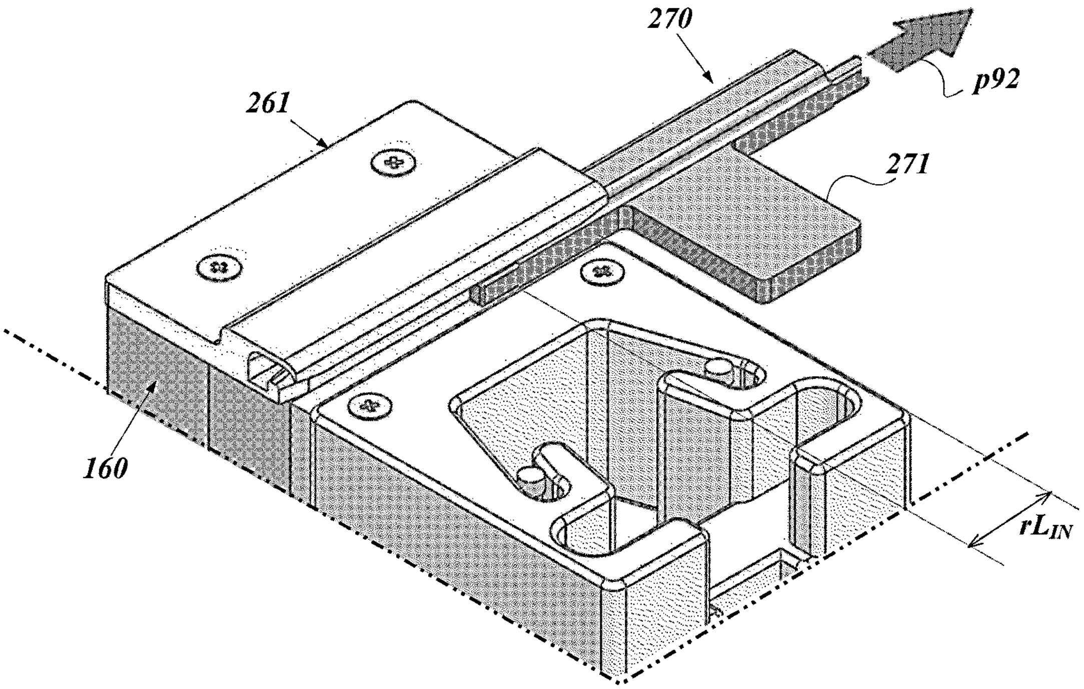
FIG. 10 shows only a portion of the upper part of the base platform to which the latch plate of FIG. 9 is applied.

In other embodiments according to the present invention, the slide plate may be configured so that the anchor block can be unfastened and then removed by lifting vertically from the seating plane 111 without separating the slide plate completely from the fixing plate 261, that is, in a state where the slide plate is partially assembled to the fixing plate 261. FIG. 10 shows only a part of the upper portion of the base platform to which the slide plate 270 structured according to this embodiment is applied.

In the slide plate 270 structured according to the embodiment of FIG. 10, the part other than the interlock part is formed of a latch strip 271 whose width is much narrower than that of the interlock part. Unlike the latch plate 162' in the embodiment illustrated in FIG. 5, this latch strip 271 covers only the rear central portion of the receiving tube of the seated anchor block.

Replacing the seated anchor block, a worker pushes and pulls the slide plate 270 of this embodiment to one side (p92) to completely remove the latch strip 271 from the top of the anchor block. Even in this fully open state where the upper surface of the anchor block is completely exposed, the interlock part of the slide plate 270 is still partially engaged. Therefore, when returning the slide plate 270 to its original position after replacing the anchor block with a new one, there is no need to reassemble the slide plate 270 and the fixing plate 261 by fitting the shapes of the interlock parts with each other. A very simple work of pushing and sliding the partially engaged slide plate 270 to its original position is sufficient.

Figure 11:
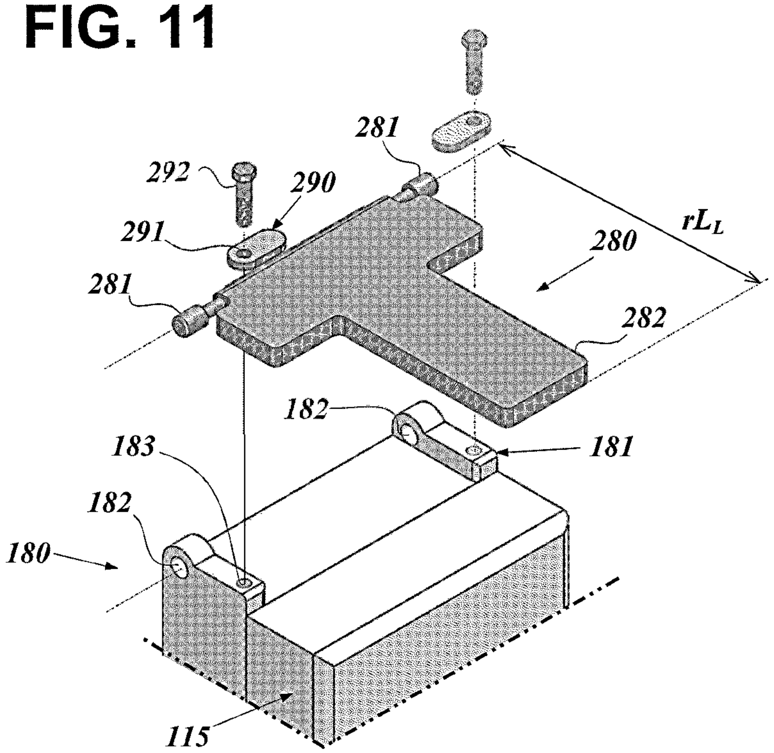
FIG. 11 is an exploded view of a stopper constructed according to another embodiment of the present invention.

In still another embodiment of the present invention, where the latch plate can be unfastened when the anchor block is removed, the latch plate may be constructed as a single structure. FIG. 11 shows an exploded view of the structure of a stopper constructed according to this embodiment.

The stopper of this embodiment includes a knob 180, a plate-type rotary latch 280, and a pair of locks 290. The knob 180 operates in the same manner as in the above-described embodiment, and axial walls 182 of a predetermined height are formed at both sides on the top of the knob 180. Only single lock 290 may be included in the stopper instead of one pair.

Since a pair of shaft rods 281 are inserted, with an elastic body between them, into both sides of rear end of the rotary latch 280, the rotary latch 280 can rotate around the shaft rods 281. The rotary plate 280 illustrated in the drawing is configured to have a latch strip 282 whose front part is narrower than the rear part, but may be configured in a different shape, for example, a square shape.

After the pair of shaft rods 281 inserted into the rotary latch 280 are installed between the axial walls 182 while the elastic body therebetween is compressed in the longitudinal direction by a worker, they are pushed outwardly by the elastic body and are respectively inserted into the lateral holes 182 formed on facing sides of the axial walls 182. Accordingly, the rotary latch plate 280 is rotatable about the shaft rods. The rotary latch 280, like the latch plates of the previously described embodiments, is adjusted to a length ($rL_L$) corresponding to the stopping length ($SP_L$).

Each of a pair of locks 290 (or single lock) has a through hole 291 formed at one end. With this through hole 291 aligned with a screw hole 183 formed at the top of the axial wall 182, a bolt 292 is inserted into the through hole and screwed to the screw hole 183 of the axial wall 182, thereby assembling the lock 290 to the top of the axial wall 182. At this time, the bolt 292 is fastened to the axial wall 182 with a slight gap so that its head does not compress the lock 290.

Figure 12:
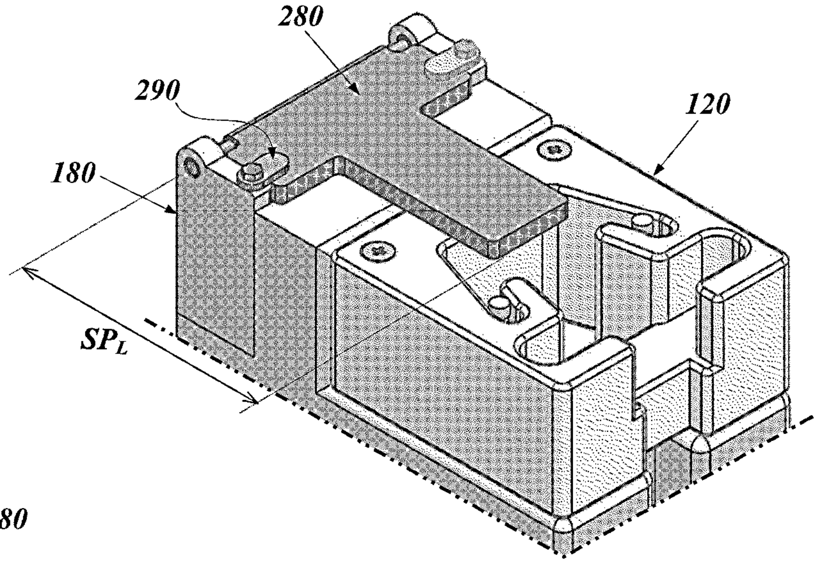
FIG. 12 is a perspective view of the upper part of the base platform showing the stopper of FIG. 11 in a fully assembled state.
Figure 12:
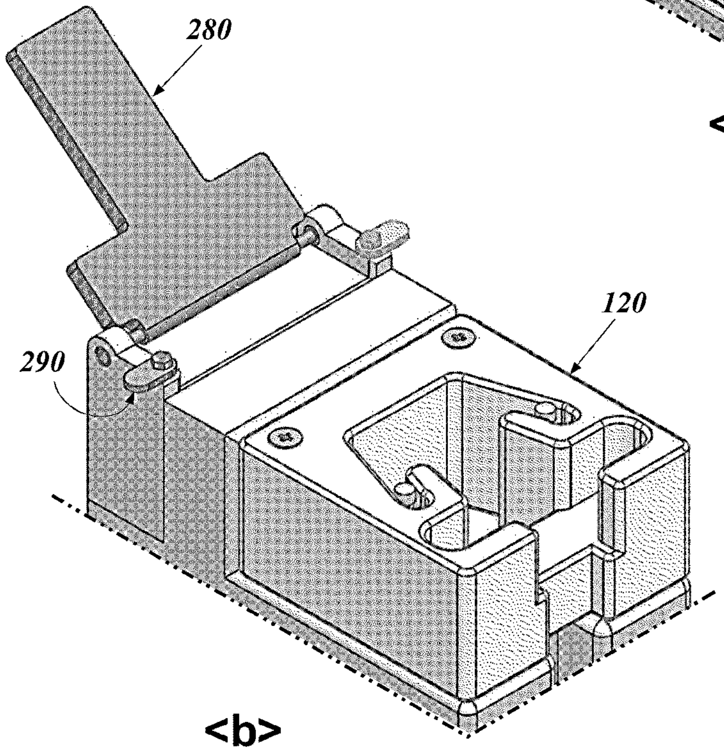

FIG. 12 is a perspective view of the upper part of the base platform showing the stopper according to the present embodiment in a fully assembled state. <a> shows a state in which the rotary latch 280, not capable of rotating upward due to the lock 290 blocking from above, covers a part of the top side of the anchor block 120 mounted on the base platform, and <b> shows a state in which the top side of the anchor block 120 is completely opened by rotating the rotary latch 280 upward after turning the lock 290 horizontally to release the blocking on the rotary latch 280.

In the embodiment to which the rotary latch 280 is applied, the anchor block 120 can be removed from the base platform by simply turning the lock 290 and flipping the rotary latch 280 upward as illustrated in <b> of FIG. 12.

In a case that the base platform to which the above-described rotary latch 280 is applied as a stopper is used, the rotary latch 280 can be opened by releasing of blocking of the lock 290 even when taking out a fastener inserted into the anchor block 120. In other words, it is possible to construct a BCCI with the base platform that does not include the knob 180 to pull the latch plate rearward.

Figure 13A:
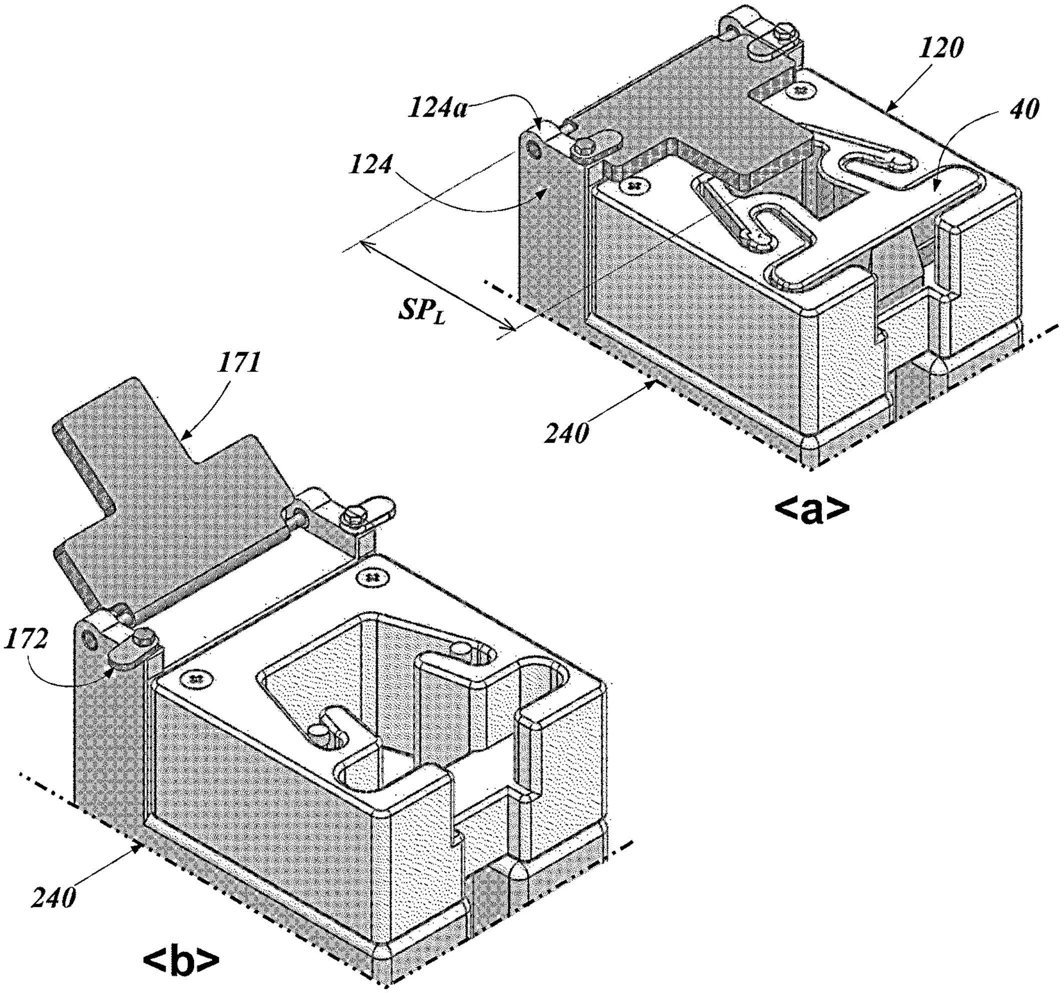
FIGS. 13A to 13C are diagrams showing the operation mechanism and configuration of a stopper assembled onto the base platform according to still other embodiments of the present invention.

In the embodiment in which the base platform is configured in this way, the axial walls 182 described in the right-previous embodiment are formed on the top side of the support wall. Since the base platform of this embodiment does not require space for accommodating the knob, only the front step plane, that is, the seating plane 111, may be formed on the top thereof. FIG. 13A is a perspective view showing the upper part of the base platform 240 configured as described above with the anchor block mounted, where <a> represents a locked state in which the rotary latch 171 blocks the fastener 40 and the anchor block 120, and <b> represents a state in which the rotary latch 171 is open and the fastener has been pulled out.

In this embodiment, the rotary latch 171 is provided to fit a relatively shorter stopping length ($SP_L$) compared to the base platform of the embodiment shown in FIG. 12. The lock 172 may be provided only on one axial wall 124*a*, similar to the above-described embodiment.

In case of using the BCCI to which the base platform 240 of this embodiment is applied, a worker unlocks the lock 172 to open the rotary latch as shown in <b>, in the same way as when replacing the anchor block 120, when pulling out the binding-completed band cable from the receiving tube. Then, after inserting the fastener of a new band cable into the anchor block 120 and closing the rotary latch 171, the lock 172 is rotated to block the rotary latch 171, and in that state, the harness is tied up using the band cable of the inserted fastener 40.

Figure 13B:
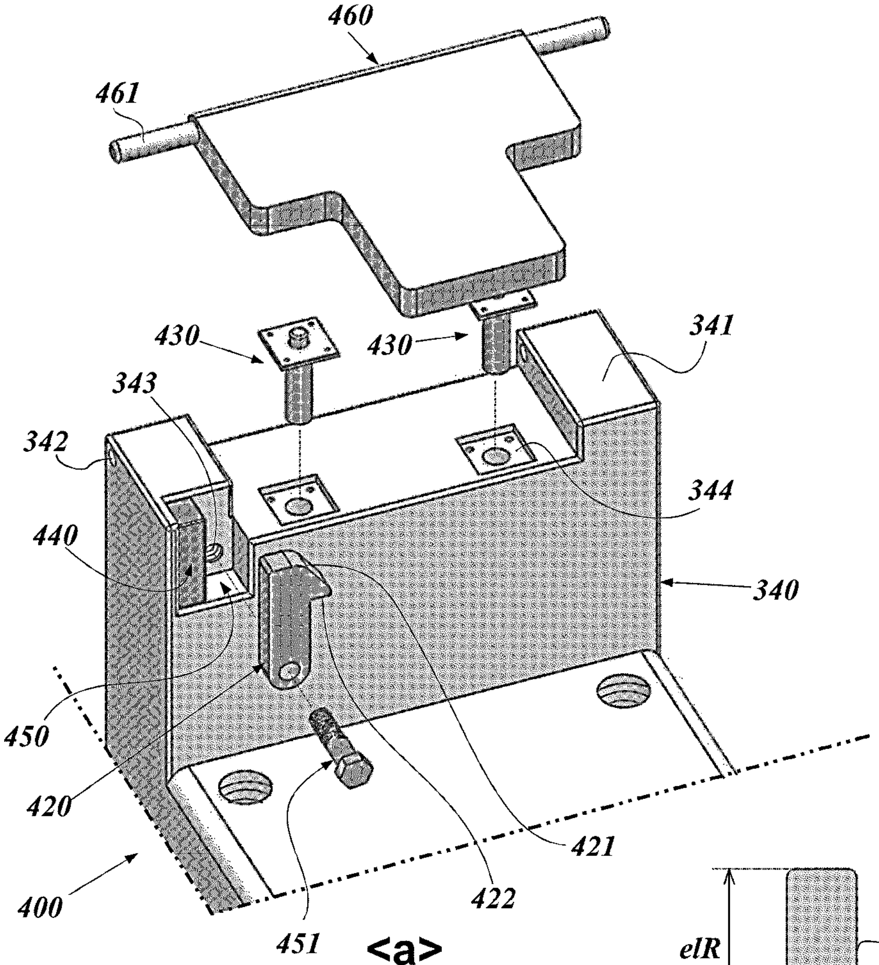
Figure 13B:
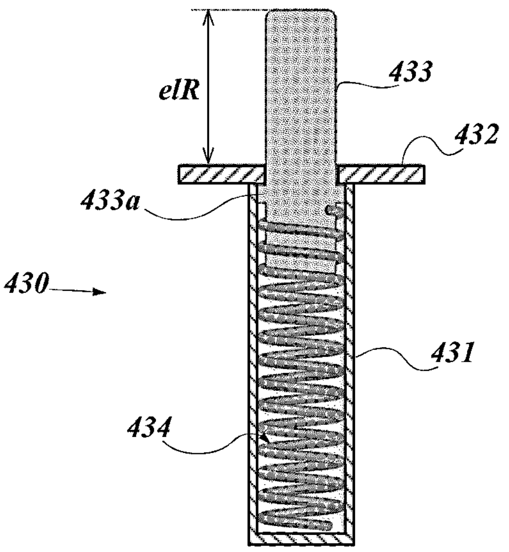

In general, when the anchor block 120 is mounted on the base platform, it is used to inspect a large number of band cables for heterogeneity and to bind harnesses with them. Therefore, the work of rotating the lock 172 and opening/closing the rotary latch 171 may be cumbersome for a worker. FIG. 13B illustrates the configuration of a stopper, provided on a support wall according to still other embodiments of the present invention, which allows the rotary latch to be brought to the required state through simpler operation.

The stopper according to this embodiment largely includes a pivotable hook 420, an ejector 430 whose length can be varied in the longitudinal direction, an elastic member 440, and a plate-type rotary latch 460. The support wall 340 of the base platform 400 constructed according to this embodiment has axial walls 341 formed at both sides on its top surface, and a latch holder 450 with the front and top open, which is the space for accommodating the pivotable hook 420, is formed to a predetermined depth in the base platform at the front side of either axial wall 341. In the drawing, the latch holder 450 is formed on only one side, but otherwise, it may be formed on both axial walls 341 in a form that is symmetrical to each other.

The pivotable hook 420 is mounted on the latch holder 450 by a bolt 451 inserted into a through hole formed in the lower part of the pivotable hook 420 and a hole 343 formed on the front-facing surface of the latch holder 450. The elastic member 440 is inserted and fixed between the side of the latch holder 450 and the mounted pivotable hook 420. The bolt 451 is fastened to the hole 343 of the latch holder 450 so that its head has a slight gap with the pivotable hook 420. Therefore, the pivotable hook 420 is in a state where it can swing in the direction toward the rotary latch 460 and in the reverse direction, with the bolt 451 as the central axis.

In the case of the base platform where the latch holder 450 is formed on both sides, the pivotable hook 420, etc. may be provided on both sides in a form that is symmetrical to each other.

The pivotable hook 420 has a head 421 with at least one side protruding perpendicular to the longitudinal direction from its body of a predetermined length, and a square-shaped jaw 422 is formed at the bottom of the head 421. The top of the protruding side of the head 421 inclines as the height of the head decreases toward the side end.

The rotary latch 460 of this embodiment is installed on the top side of the support wall 340 by a shaft rod 461 to be inserted into a through hole formed at its rear end and the lateral holes 342 formed on both axial walls.

The ejector 430, as shown in <b> of FIG. 13B which partially shows in cross section, includes a cylindrical housing 431, a spring 434 equipped in the housing, a cover plate 432 whose central portion is penetrated with a diameter narrower than the inner diameter of the housing 431, and an actuator 433 of a predetermined length whose the diameter is narrower than the inner diameter of the housing 431. A ring-shaped stopper 433*a* with the same diameter as the inner diameter of the housing 431 is formed on the outer peripheral surface of lower part of the actuator 433.

The spring 434 has an elastic force capable of changing the length by the height (elR) at which the actuator 433 is exposed above the cover plate 432 in a state where the stopper 433*a* of the actuator 433 is in close contact with the cover plate 432.

At least one ejector holder 344 into which the ejector 430 is installed is formed at the top of the support wall 340. In this ejector holder 344, a hole having the same outer shape as the housing 431 of the ejector 430 is formed vertically on the stepped surface at the top of the support wall 340. The height of the step of the ejector holder 344 is greater than the thickness of the cover plate 432.

Therefore, when the cover plate 432 of the ejector 430 is installed in the stepped area of the ejector holder 344 by fastening with screws, etc., its top is no higher than the top of the support wall 340.

Figure 13C:
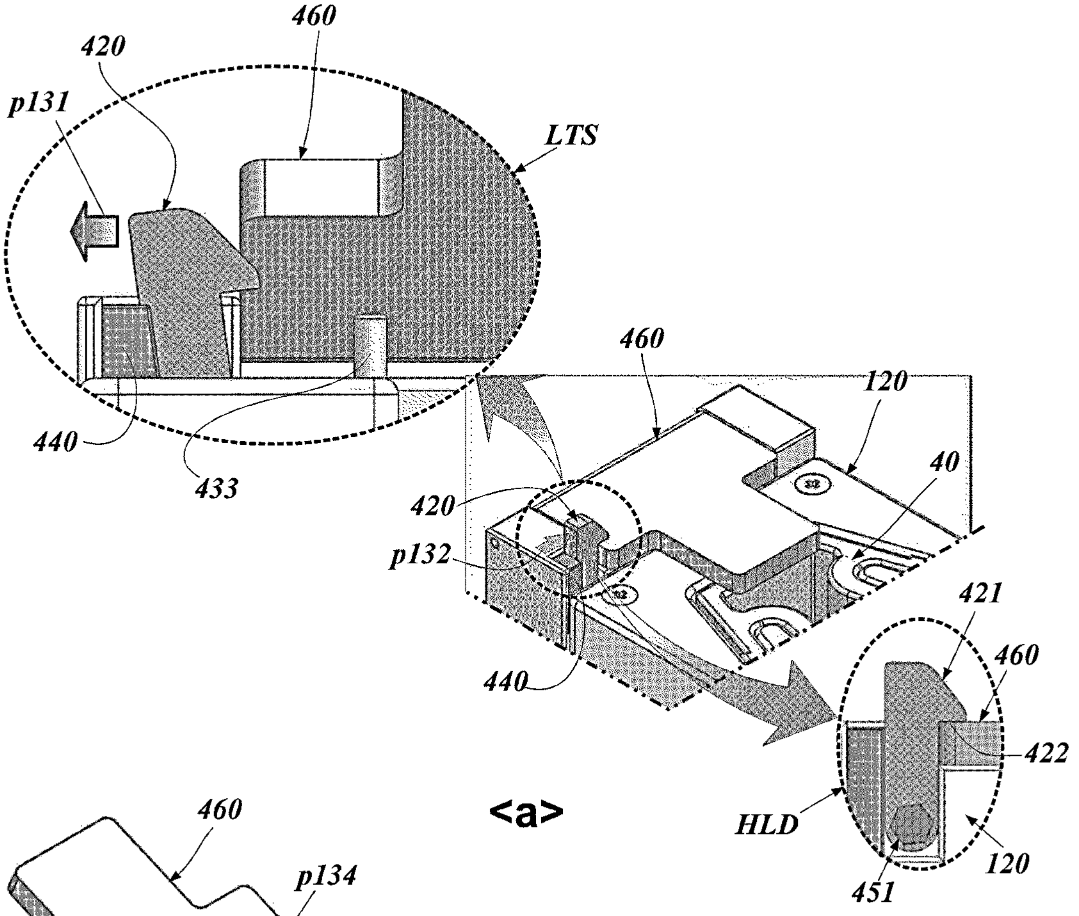
Figure 13C:
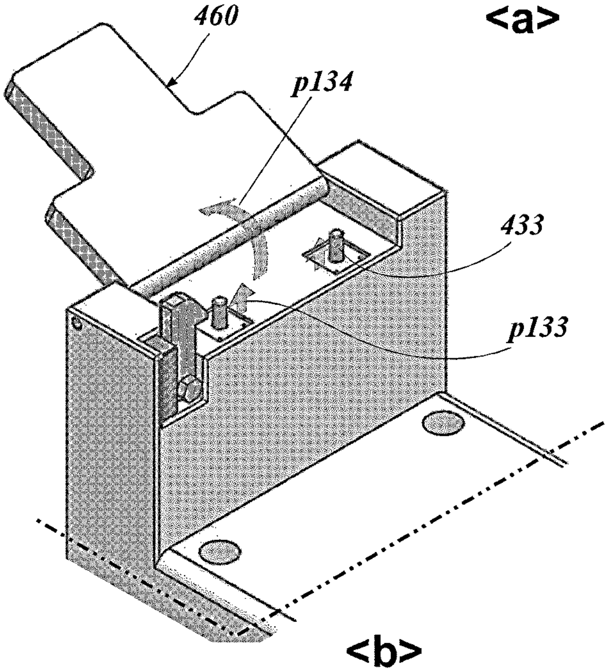

FIG. 13C shows how the stopper constructed as described with reference to FIG. 13B operates. <a> is a perspective view of the upper part of the base platform when the rotary latch 460 is closed while blocking the rear part of the fastener 40, in a state where the fastener 40 is inserted into the mounted anchor block 120, and <b> is a perspective view of the upper part of the base platform when both fastener and anchor block are removed in a state where the rotary latch is open.

The partial front views shown together in <a> show a state (LTS) in which the pivotable hook 420 is pushed outward (p131) after the side end of rotary latch 460 comes into contact with the inclined surface of the head 421 of the pivotable hook 420 when the rotary latch 460 is closed, that is, when a worker presses the rotary latch 460 downward, and another state (HLD) in which the rotary latch 460 is completely closed. When the pivotable hook 420 is pushed outward, the elastic member 440 inserted at the pushed side is compressed and elastic force is accumulated.

After the rotary latch 460 rotates further downward and comes into contact with the upper end of the actuator 433 of the ejector 430, the actuator 433 moves downward while compressing the spring 434 within the housing 431. When the bottom surface of the rotary latch 460 pressed by a worker comes into close contact with the upper surface of the anchor block 120, the upper surface of the rotary latch 460 passes through the jaw 422 of the pivotable hook 420. At that moment, the pivotable hook 420 is pushed inward by the restoring force of the elastic member 440 (p132), so that the jaw 422 of the pivotable hook 420 automatically blocks the upper side of the rotary latch 460 (HLD). Accordingly, the rotary latch 460 is locked while covering a part of the upper side of the fastener 40.

When a worker wants to inspect or work on another fastener, the head 421 of the pivotable hook 420 is pushed outward to release the blocking state of the rotary latch 460. The moment the blocking is released, the spring 434 compressed in the housing 431 of the ejector 430 is momentarily extended to its original state, causing the rotary latch 460 to move upward through the actuator 433 (p133). Due to this momentary pushing force, the rotary latch 460 is flipped backward (p134), maintaining the top of the fastener and anchor block in a completely open state.

Accordingly, a worker can pull out the fastener inserted into the anchor block by simply pulling the band cable without using the other hand.

In the embodiment described with reference to FIGS. 13B and 13C, a worker can replace the fastener and remove the anchor block through an extremely simple operation of pressing the rotary latch using only the fingers and pushing the pivotable hook outward from the base platform.

The stopper of the embodiment illustrated in FIGS. 13B and 13C can also be applied to a BCCI in which the anchor block is made integrally with the base platform such that it is not separated from the base platform.

Figure 14:
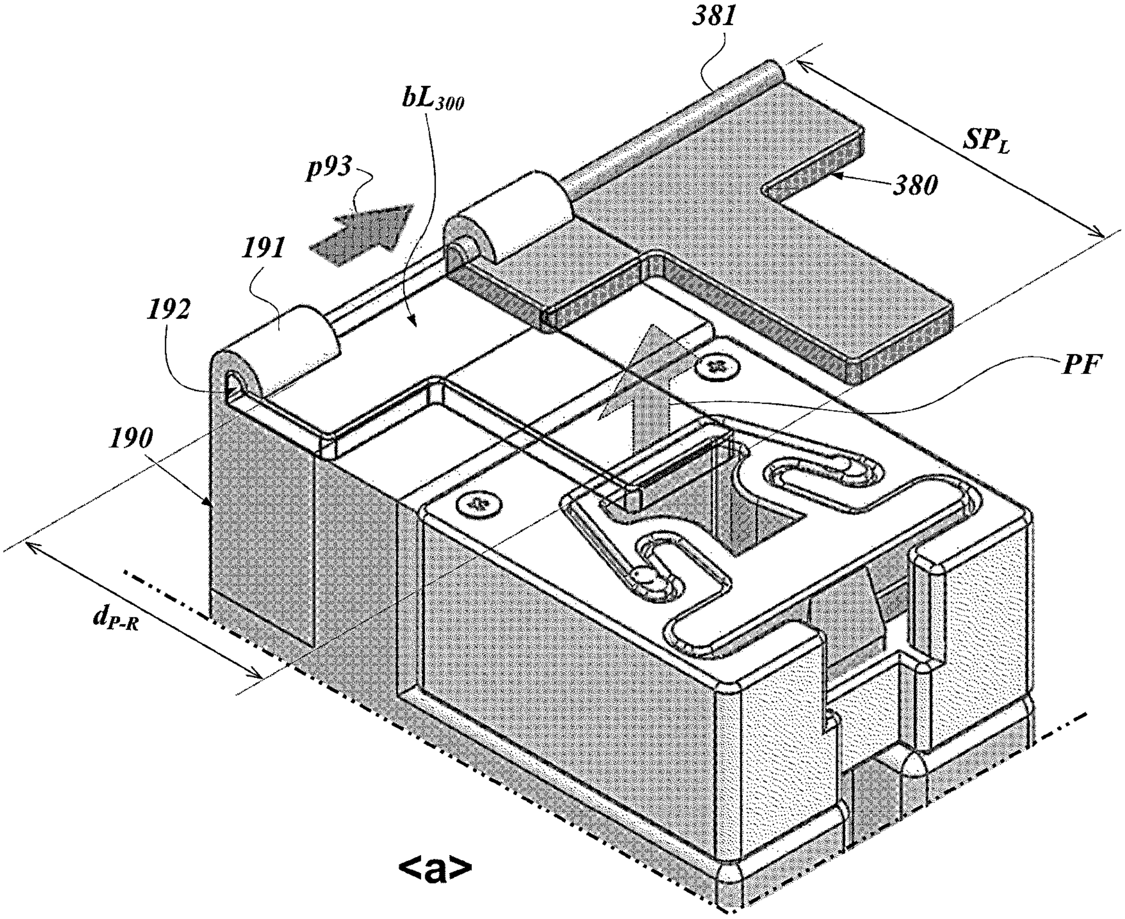
FIG. 14 shows a portion of a perspective view and a side view of the upper part of the base platform equipped with a stopper constructed according to another embodiment of the present invention.
Figure 14:
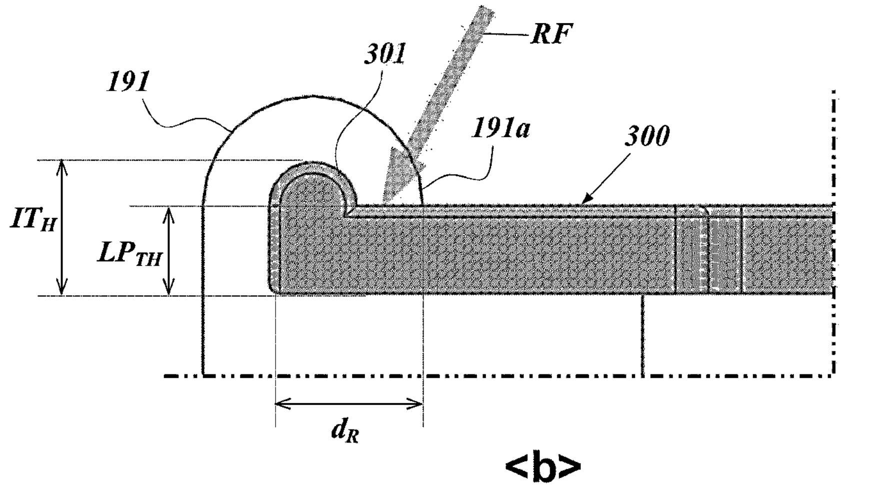

In another embodiment according to the present invention, the stopper can be configured such that a latch plate slides instead of rotating to open completely the top side of the mounted anchor block. FIG. 14 shows a part of a perspective view and a side view of the upper portion of the base platform with a stopper constructed according to this embodiment.

In the knob 190 structured according to this embodiment, at least one fixing member 191 having a ring-shaped cross section is formed on or combined to the rear of the top side of the knob 190. As illustrated in the drawing, this fixing member 191 is opened toward the front of the base platform by an amount corresponding to the thickness ($LP_{TH}$) of the latch plate. Inside the fixing member 191, a tunnel 192 with a height ($IT_H$) longer than the opened height ($LP_{TH}$) is formed along the longitudinal direction of the fixing member 191.

In addition, the latch plate 380 according to this embodiment has a configuration in which a guide bar 381 whose cross section is the same as that of the tunnel 192 is formed at the rear end of the latch plate 380. According to this configuration, the latch plate 380 is assembled to be located in the center of the knob 190 with the guide bar 381 inserted into the tunnel 192 of the fixing member 191 ($bL_{300}$). For convenience of assembly, the fixing member 191 or the guide bar 381 may be configured so that the entrance of the tunnel 192 has a relatively wider shape that can surround the shape of the side end of the guide bar 381.

The latch plate 380 of this embodiment is also the same as the latch plate of the above-described embodiments in that its length is adjusted to the stopping length ($SP_L$).

When using the BCCI to which the stopper of this embodiment is applied, the upward force (PF) that acts when a worker pulls the band cable to fasten the wiring harness is extinguished by the reaction force (RP) of the ring-shaped tip of the guide bar 381. Therefore, the fastener remains inserted into the receiving tube.

The reaction force (RP) of the guide bar 381 must resist the strong torque that increases proportionally as the distance ($d_{P-R}$) between the fastener and the acting point of the force (PF) pushing the latch plate 380 upward increases. Therefore, in order to prevent damage due to repeated actions of the force that is increased by the ratio ($=1+d_{P-R}/d_R$) of the distance from the rotation axis to the acting point of force, the guide bar 381 must be made of a more rigid material. If the fixing member 191, in particular, its front end 191*a* to be in close contact with the top of the latch plate 380 is configured to be located closer to the acting point of force in the upward direction, for example, closer to the front end of the knob 180, or further forward than that front end, the strength of the reaction force required for stopping the fastener decreases. This configuration facilitates material selection for the fixing member.

In the case of a BCCI adopting a base platform equipped with the stopper configured as illustrated in FIG. 14, a worker can completely open the top of the anchor block by pushing the latch plate 380 from the side (p93) and then immediately remove the mounted anchor block.

Like the slide plate 262 of FIG. 9, the latch plate 380 of this embodiment may also be provided with a pressing protrusion on its side. Alternatively, the guide bar 381 may be formed to be slightly longer than the width of the knob 190.

When the BCCIs of various embodiments of the present invention described above are applied, the above-mentioned inspection of heterogeneity and binding of the band cable around the harness can be performed using a new anchor block 120' for another type of band cables, simply by loosening and refastening the tightening screws 150 that secure the mounted anchor block. That is, there is no need to separate the BCCI from the workbench 30, connect the wires connected to the bottom of the BCCI to another BCCI suitable for the new type of band cables, and then fix it to the workbench again, as in the prior art. The time to set up a BCCI for inspection of different type of band cables is remarkably reduced.

Figure 15:
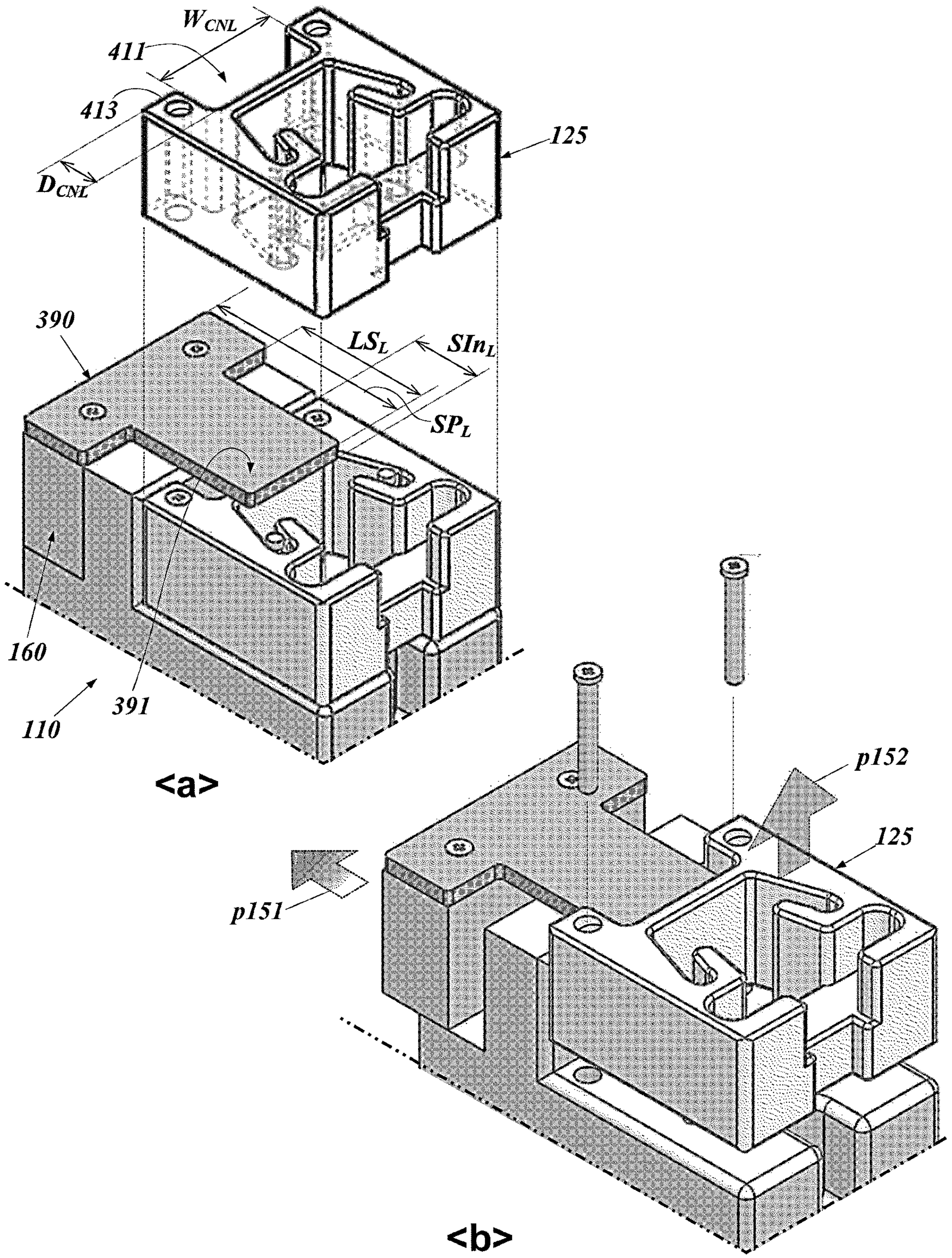
FIG. 15 is a perspective view showing the upper part of an instrument configured to remove an anchor block without separating the latch plate, with the anchor block installed and removed, respectively, according to another embodiment of the present invention.

In the embodiments described so far, the anchor block can be removed immediately without disengaging the latch plate and the knob or the support wall by opening the top of the anchor block through position change in fully or partially sliding/rotating manner of the latch plate relative to the knob or support wall. However, in another embodiment according to the present invention, the BCCI may be configured so that the anchor block can be pulled out immediately while the latch plate is fixed to the knob. FIG. 15 are perspective views of the BCCI constructed according to the present embodiment, showing only its top with relevant components.

In the BCCI of the embodiment illustrated in FIG. 15, the anchor block 125 to be mounted on the base platform 110, as shown in <a>, has a kernel 411, a concave portion extending from the top to the bottom, formed from the back surface (the surface facing the supporting wall) that is indented inward. This kernel 411 is recessed inward so that there is a gap, on the top surface of the anchor block 125, between the recessed floor and both the area occupied by the bolts, which are inserted into the through holes 413 of the anchor block 125, and the area of the receiving tube into which a fastener is inserted, and so that its depth ($D_{CNL}$) is longer than the length obtained by subtracting the operating distance of the knob 160 from the distance ($SIn_L$) between the tip of the latch plate 390 and the rearmost surface of the anchor block 125 when the knob 160 is in the original position.

By forming the kernel 411 indented as described above, both side walls of the kernel become leg parts, each of which a fastening bolt is inserted into.

The latch plate 390 of this embodiment includes a latch strip 391 whose front part has a width smaller than that of the rear part. The latch strip 391 has a width no wider than the width ($W_{CNL}$) of the kernel 411, and it has a length ($LS_L$) such that its front end is located further forward than the rear end (more strictly, the rear end of the area occupied by the bolt inserted into each through hole 413 of both leg parts) of the anchor block 125, under the condition that the knob 160 is in the original position. The latch plate 190 is also adjusted to the stopping length ($SP_L$) like the latch plates of the above-described embodiments.

In the BCCI of this embodiment, since the top of the bolts on the leg parts connecting the anchor block 125 to the base platform 110 are open, as shown in <a>, even in a state where the latch plate 390 partially covers the top of the anchor block 125, a worker first unfastens the bolts and pulls the knob 160 backward (p151) as shown in <b>. Then, the front part of the latch strip 391 moved rearward is located at the top of the kernel 411, due to the above-described configuration, so that no part of the top of the anchor block 125 is blocked, that is, its entire upper surface is exposed upward. Accordingly, a worker can lift the anchor block 125 upward (p152) and remove it from the base platform 110 without removing the latch plate 390 from the knob 160.

Figure 16:
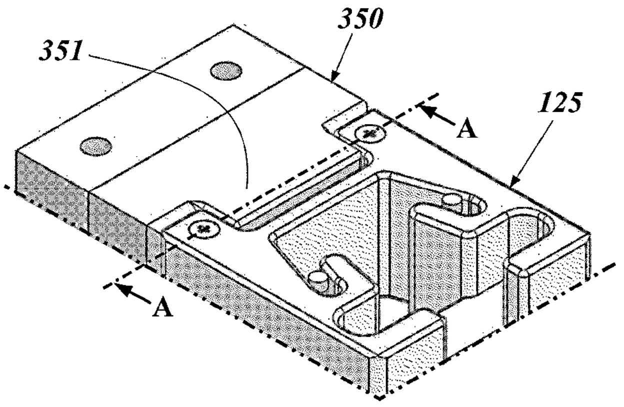
FIG. 16 is a perspective view and a cross-sectional view showing only relevant parts of an instrument that differs from the instrument of FIG. 15 only in the structure of the support wall, according to another embodiment of the present invention.
Figure 16:
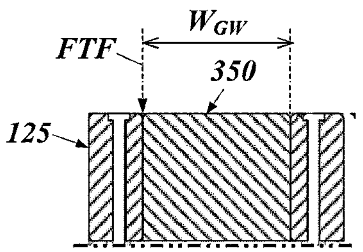

In one embodiment according to the present invention, the structure of the support wall may be configured at the base platform to fit the shape of the kernel of the anchor block. FIG. 16 shows a partially illustrated perspective and cross-sectional view of a BCCI having a base platform constructed in accordance with the present embodiment.

The base platform of this embodiment is configured to have a guide pillar 351 that is made by protruding a portion of the support wall 350 forward. The guide pillar 351 has a width ($W_{GW}$) equal to the width ($W_{CNL}$) of the kernel 411 of the anchor block 125, at least in terms of width, and a protruding height that is no longer than the depth ($D_{CNL}$) of the kernel 411. Therefore, when the guide pillar 351 is inserted into the kernel 411 of the anchor block 125, their sides come into contact with each other (FTF). When mounting the anchor block 125 on the seating plane of the base platform, the anchor block can be easily positioned at the correct seating plane where the through holes 413 for bolt fastening and the screw holes on the seating plane are concentric with each other, by entering the guide pillar 351 of the support wall 350 through the lower entrance of the kernel 411 and sliding the anchor block downward.

Figure 17:
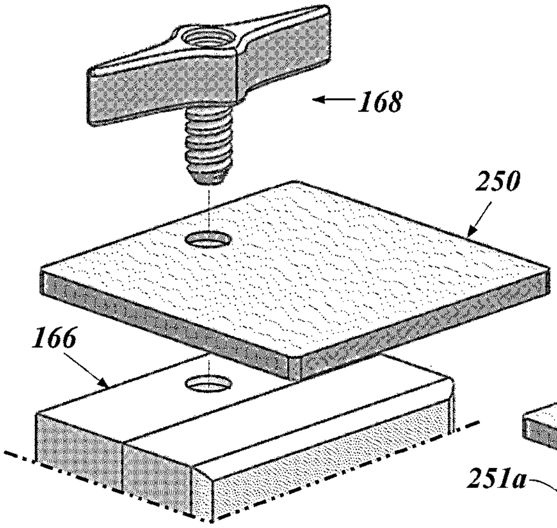
FIG. 17 is a perspective view showing only related components of an instrument configured to more easily remove the latch plate, according to still other embodiments of the present invention.
Figure 17:
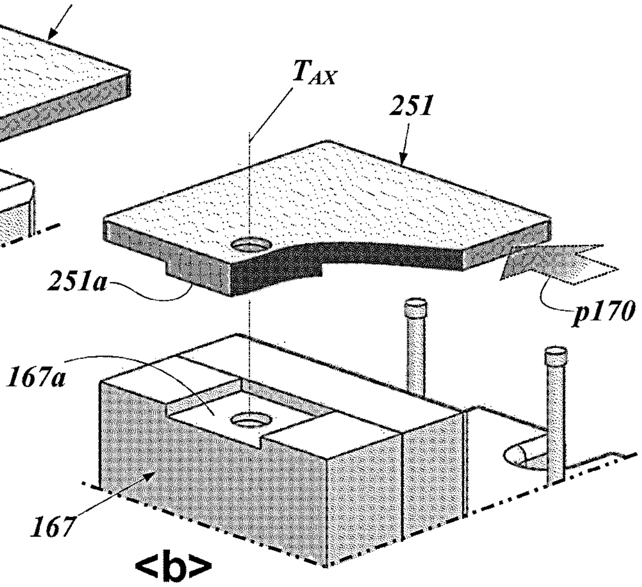

In another embodiment according to the present invention, a BCCI is configured such that combining/separating latch plate is relatively easy, compared to the above-described BCCIs in which the latch plate is coupled to the knob using a general bolt fastening method. FIG. 17 shows only the relevant components for the BCCI of this embodiment.

In the embodiment of FIG. 17, as shown in <a>, a single through hole is formed in the latch plate 250, and a single screw hole is formed correspondingly at the top of the knob 166. The rotary handle bolt 168 is inserted into the through hole and screwed into the screw hole, thereby fixing the latch plate 250 to the knob 166.

The BCCI of this embodiment has fewer coupling holes compared to the BCCI 100 illustrated in FIG. 2, making combination/separation simpler. In addition, as for the BCCI 100 of FIG. 2, tools must be used for screw fastening and disassembly, but in the BCCI of this embodiment, the latch plate can be combined and separated immediately by rotating the rotary handle bolt 168 by hand, so that cumbersome secondary tasks such as finding a tool and putting it back in place become unnecessary. That is, compared to the BCCI 100 of FIG. 2, the workability of anchor block replacement is improved.

In the case of the BCCI illustrated in <a> of FIG. 17, since the latch plate 250 is coupled to the knob 166 through a single hole, a large torque with the coupling hole as the axis (TAX) is applied onto the coupled surface if a force is applied to its side. Therefore, if the worker's pulling force to cut a portion of the band or the force of holding the BCCI with the other hand generates this torque repeatedly, the latch plate 250 may rotate slightly to weaken the coupling force.

The latch plate 251 and the knob 167 shown in <b> are configured to eliminate the above weakness to be caused from single hole coupling. A recessed pocket 167*a* is formed on an area of the top of the knob 167, and the latch plate 251 is provided with a bottom protrusion 251*a* that protrudes downward and has an external shape fitting the space of the pocket 167*a* (contacting closely to at least both sides of the pocket).

When the latch plate 251 is coupled to the knob 167 by the rotary handle bolt 168 while being inserted into the pocket 167*a* and assembled, the force applied to the side of the latch plate 251 is canceled out by the reaction force produced when the bottom protrusion 251*a* is caught on one side of the pocket 167*a*, so that no torque is applied to the coupling hole axis (TAX).

In the embodiment illustrated in <b> of FIG. 17, a concave portion is formed on the knob 167 and a protrusion is formed on the latch plate 251, but, concavo-convex portions may be formed conversely. In other words, even if a recess is formed in the latch plate and a protrusion is formed in the knob, the same effect can be obtained.

Meanwhile, as described above, in addition to checking whether the type of band cable that should be used for the corresponding position of the wiring harness is matched or not, the work of binding the relevant position of the harness with an MBC is performed. In the process of binding with a band cable in this way, a worker pulls the band strongly, and the resulting tensile force is applied to the anchor block coupled with the inserted fastener. At this time, due to mechanical tolerance or clearance, the fastener may move slightly while it is inserted into the receiving tube.

If the up-down pin is located very close to one side of the fastener when one or more up-down pins (131) remain in place without descending, the tensile force may also be applied to the side of the up-down pin due to the movement of the fastener caused from the tensile force.

Figure 18:
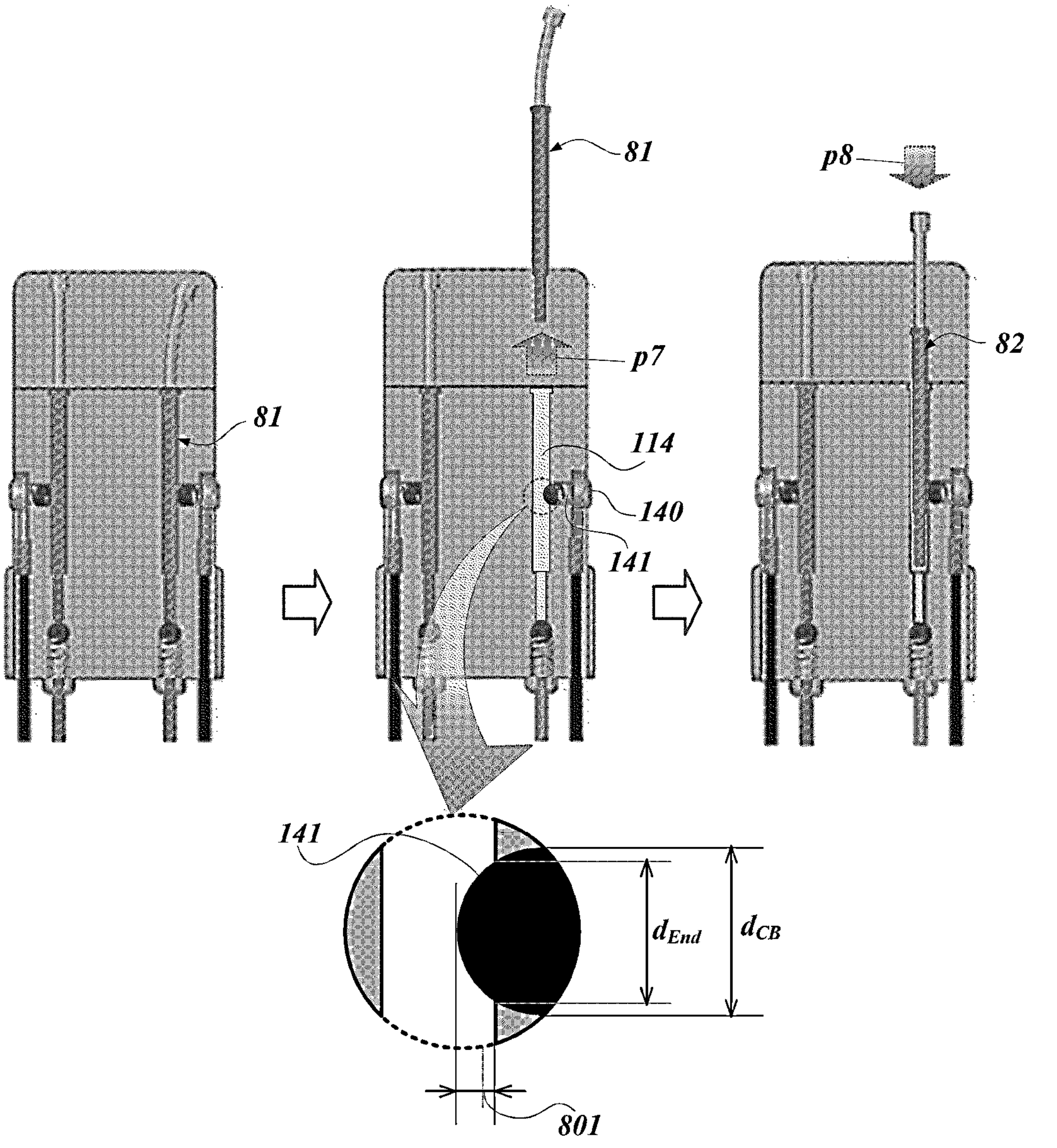
FIG. 18 schematically shows the replacement process for the pin switch installed in the instrument of FIG. 2.

If the fatigue of the up-down pin reaches its limit and becomes bent or broken as such phenomenon is repeated, the pin switch cannot function properly and must be replaced with a new pin switch. In the BCCI 100 constructed according to an embodiment of the present invention, in that case, the pin switch can be very easily replaced while the BCCI 100 is fixed to the workbench, without having to separate it from the workbench and disassemble its bottom portion. FIG. 18 schematically shows the pin switch replacement process for the BCCI 100 constructed in accordance with the present invention.

If the pin switch 81 has physical damage or deformation of the up-down pin, a worker pulls the pin switch 81 upward and removes it from an installation hole 114 (p7). Even when the pin switch is removed from the installation hole 114, the connection ball 141 included in the configuration of the side connection terminal of the base platform protrudes only a certain gap 801 inside the installation hole 114. This is because the hole formed up to the installation hole 114 for electrical connection with the connection terminal 140 has an inner diameter ($d_{End}$), at its end, shorter than the diameter ($d_{CB}$) of the connection ball 141.

Since the connection ball 141 protrudes inside the installation hole 114 only by a certain gap in that way even in the state in which the pin switch is removed, the connection ball 141 retreats toward the connection passage to the connection terminal 140 without impeding entry of a new pin switch into the passage when inserting the new pin switch into the installation hole 114. In the state where the new pin switch is fully inserted, the connection ball is brought into close contact with the housing barrel of the inserted pin switch by the restoring force caused from the compression of the connection spring 142 by the amount 801 of ball's retreat.

After removing the defective pin switch 81 from the base platform, a worker completes the pin switch replacement work by inserting the new pin switch 82 all the way into the installation hole 114 (p8).

On the other hand, if the wiring harness to be worked on changes, there may also be cases where the position of BCCI needs to be moved besides replacing the anchor block to be mounted on BCCI. As explained earlier, moving a BCCI may require not only detaching the BCCI from the workbench and fixing it onto a different location, but also drilling a new passage hole in the workbench for passage of the wires connected to the POP terminal. The time required for these additional preparation works reduces harness product productivity.

Figure 19:
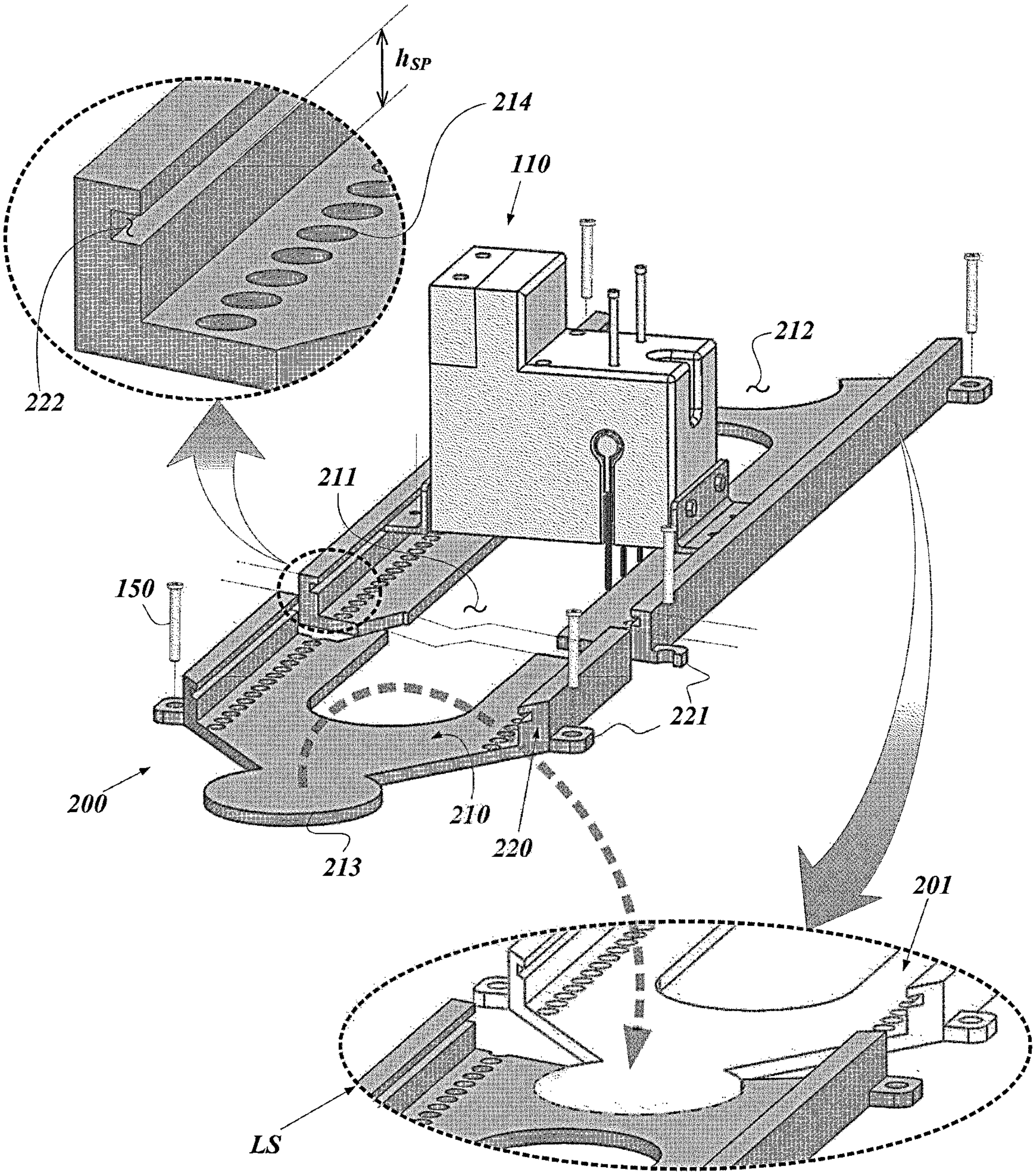
FIG. 19 is a view showing that an instrument can be moved along the guide rail while it is mounted on a guide station unit constructed according to an embodiment of the present invention.

Taking these factors into consideration, in one embodiment according to the present invention, a guide station unit (GSU) is presented that allows simple and quick movement and fixation of a BCCI. FIG. 19 exemplarily shows how a BCCI is fixed to the GSU 200 constructed according to an embodiment of the present invention. In FIG. 19, the GSU 200 is shown with some sections cut in the longitudinal direction.

The GSU 200 according to an embodiment of the present invention includes a base panel 210 with a predetermined width that extends long, and both guide walls 220 standing vertically on both sides of the base panel 210. The GSU 200 is fixed onto a proper location of the workbench, where work on harnesses takes place, by inserting tightening screws 150 into a plurality of fixing protrusions 221 that protrude laterally from both guide walls 220.

On both guide walls 220, guide grooves 222 are formed in a straight line along the longitudinal direction at a predetermined height on the inner sides facing each other, forming a pair of parallel rails through which the base platforms are guided and moved. As shown in FIG. 19, the side ends of the bottom plates of both brackets 20 coupled to the base platform 110 of the BCCI 100 are respectively inserted into the guide grooves 222, so that the base platform is mounted on the GSU 200. In such a mounted state, the guide grooves 222 functions as rails with respect to the base platform 110, so that the base platform 110 moves only along the guide grooves 222 with its vertical movement limited.

The rail method shown in FIG. 19, which allows the base platform 110 of the BCCI to move along the longitudinal direction of the GSU 200, is nothing more than a simple example. In a manner not illustrated, a structure of the GSU 200 may be presented to provide rails to the base platform 110, and a structure that can be mounted onto the GSU structure may be formed at the base platform. As an example like this, rails, along which the base platform can be moved with its vertical movement limited, can be made by forming horizontal grooves on the front and rear lower portions of the base platform, and protrusions to be inserted into the horizontal grooves long along the longitudinal direction on both guide walls of the GSU, At the center of the base panel 210, one or more passage holes 211 are formed along the length of the base panel. It is desirable to form as few passage holes as possible and to have as long a length as possible. This is to ensure that, when the mounted base platform 110 is moved along the guide grooves 222, the electric wires connected to the bottom are hindered as little as possible from being caught by ribs (the portions of the base panel that remains uncut) between passage holes.

In the GSU 200 illustrated in FIG. 19, guide grooves 222 on both sides are formed at a predetermined clearance ($h_{SP}$) from the upper surface of the base panel 210. This is to allow the base platform to keep moving while the wires are accommodated in the space between the base platform 110 and the base panel 210 created by the clearance gap ($h_{SP}$) if the wires connected to the bottom of the base platform 110 moving along the rails of the guide grooves could be pulled even when they are caught on the rib.

Accordingly, in the case where a single passage hole is formed long in the base panel 210 without a rib, the guide grooves 222 may be formed in the guide walls 220 on both sides without the clearance gap ($h_{SP}$).

The base panel 210 is formed in a structure in which the front end and the rear end in the longitudinal direction can be engaged with each other. As an example of a structure that can be engaged with each other, a linking hole 212 is formed at one end of the base panel 210, and a linking head 213 of a shape that can be inserted in the vertical direction into the linking hole 212 is formed at the other end. Therefore, as shown in a portion of FIG. 19, the linking head of another GSU 201 manufactured with the same structure is inserted into the linking hole 212 of the illustrated GSU 200 and both GSUs are assembled (LS) together through such engagement. Likewise, the GSU 200 can be assembled by inserting its linking head 213 into the linking hole of another GSU and engaging with each other. The number of GSUs to be assembled is determined based on the length of the GSU and the length of the longest harness among the harnesses which must be bound by the band cables.

In another embodiment according to the present invention, the GSU may be configured in a structure in which the front and rear ends of the base panel cannot be engaged with each other. In such an embodiment, the GSU may be configured to have a relatively longer length compared to when the GSU is configured to be assembled together. Also, the GSU of that length may be composed of a predetermined number of station sections combined in a foldable manner.

In an embodiment in which the GSU is configured as illustrated in FIG. 19, after assembling the required number of GSUs as described above on an area of the workbench where a worker will use to inspect the band cables for heterogeneity and simultaneously fasten them to the harnesses, a worker secures every GSU to the workbench using tightening screws.

On the area of the workbench where the guide station chain, which is a series of GSUs linked to each other, is installed, it is preferable to form narrow-width channels in a line with each other and through the longitudinal direction of the series of GSUs in order to secure movement space for the wires that needs as the BCCIs move.

When the guide station chain is installed on the workbench, a worker moves the base platform of each BCCI along the guide grooves 222 of the GSU covering the spot where the BCCI should be positioned, positions it at the spot where inspection and work are required, and completely fixes it at its exact position.

In one embodiment according to the present invention, in order to more conveniently determine the exact position of each BCCI relative to the harness, each GSU has a numerical value indicating the distance from one end to the other end in the longitudinal direction and marks, each indicating a certain interval, for example, 1 cm, are engraved on the upper surface of the base panel 210 or the upper surface of the guide wall 220 along with numerical values indicating the distance from one end, respectively.

Figure 20:
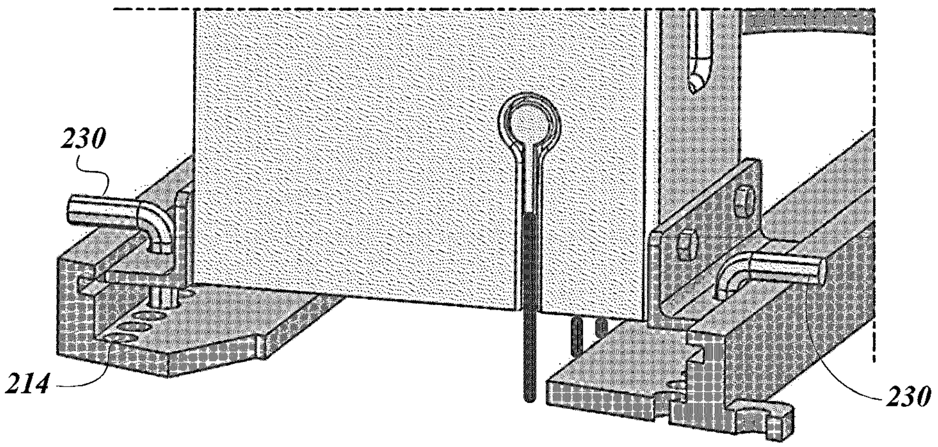
FIG. 20 is an example showing a method of fixing an instrument moved to a predetermined position with respect to the harness to the guide station unit of FIG. 19.

In the base panel 210, locking holes 214 are formed along the longitudinal direction at points adjacent to the guide wall 220, each base platform mounted on the GSU is locked at the exact position by latches 230 that pass through screw holes of the brackets 20 and are inserted into the locking holes 214, as illustrated in FIG. 20.

Instead of a locking member that is simply inserted into the locking hole 214 like a latch, a bolt or the like that couples and secures the base platform onto the GSU in the screw combining method, may be used as a locking member. Of course, in an embodiment where such locking is applied, the locking hole 214 has a female thread shape.

In the state that the BCCI is locked on the GSU 200 as in the above-described embodiment, when the wiring harness to be worked on changes, and the positions of the BCCIs are adjusted accordingly, a worker moves each BCCIs along the guide grooves 222 and fixes it in another position after removing the latch 230 to unlock it. Relocation of BCCIs becomes easier.

In the embodiment in which numbers or marks indicating the distance from the end are engraved on the base panel 210 at regular intervals, as described above, since a worker can easily know the distance, without measuring, from a specific position of the harness, for example, the U-shaped stand on which the harness is placed, it becomes much easier to determine the position of a given band cable for the given harness, i.e., the spot where the BCCIs should be positioned.

On the other hand, the harness on which the band cable binding work is to be conducted may not be straight but may have curved sections. In one embodiment according to the present invention, the guide rails for BCCIs can be provided that fits the shape of the line of the harness with such a curved section. Even if the GSUs of this embodiment are linked to each other through the linking head 213 and the linking hole 212, a curved path is made between one GSU and the other linked GSU.

Figure 21:
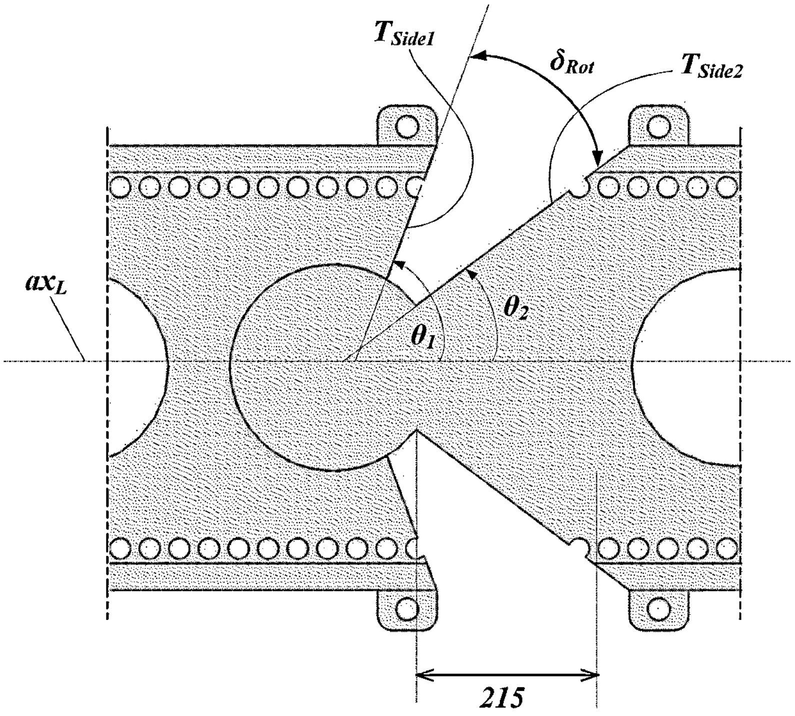
FIG. 21 shows that the guide station unit of FIG. 19 is structured so that an empty area is formed at the parts where it is linked so that it can be deviated by a certain angle with respect to other linked unit.

FIG. 21 shows the exemplary structure in detail. The base neck 215 extending from the base panel 210 to the linking head 213 is formed in a tapered shape with an angle $\theta_2$ smaller than the angle $\theta_1$ formed between the vertical plane ($T_{Side1}$) of one end and the long axis ($ax_L$) of the base panel so that an empty space at a predetermined angle $\delta_{Rot}$ with the end plane ($T_{Side2}$) of the other GSU, which is assembled by the linkage between the linking hole and the linking head 213, can be created.

Therefore, each of the GSUs linked to each other by the linking head and the linking hole can be fixed in a rotatable state with respect to the other linked GSU by the central angle $\delta_{Rot}$ of the arc of the linking head exposed toward the empty space created in the linked portion. As a result, the guide station chain may also have a bent shape in some sections.

Figure 22A:
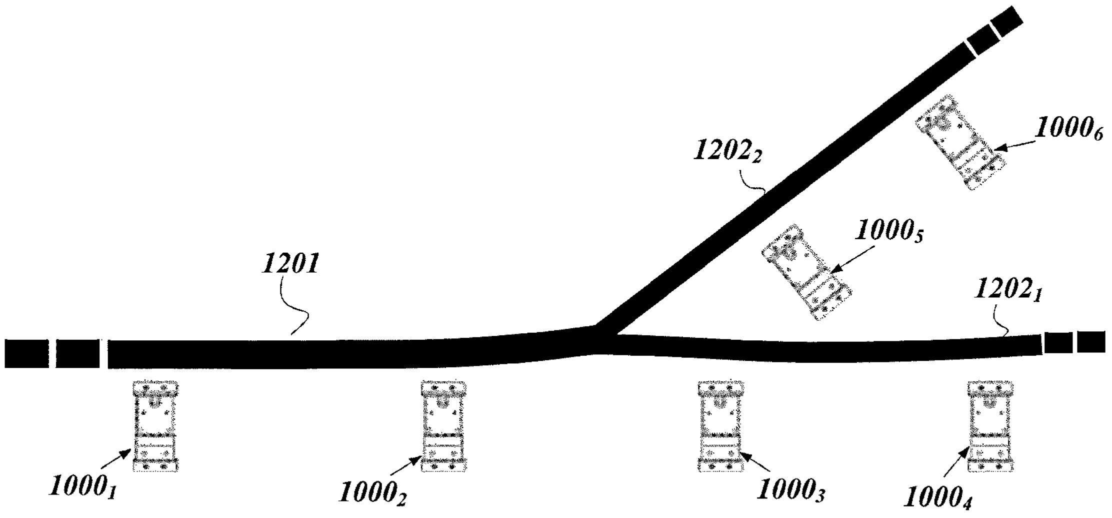
FIGS. 22A and 22B illustrate how the guide station units are linked in multiple to provide a branching guide rail on which instruments to be applied when working with wiring harnesses with branching wire bundles are mounted, according to one embodiment of the present invention.

Meanwhile, instead of being composed of a single wire bundle, the wiring harness may be manufactured in a form in which a plurality of bundles $\mathbf{1202}_1$ and $\mathbf{1202}_2$ branch from one wire bundle 1201, as illustrated in FIG. 22A. In order to bind this type of harness with the band cables, the base platforms $\mathbf{1000}_i$ (i=1, 2, 3, . . . ) must be placed side by side next to each wire bundle.

Therefore, in work on a harness with branched wire bundles, as many separate guide station chains as the number of branches of the harness are installed adjacent to the harness and branch thereof.

Figure 22B:
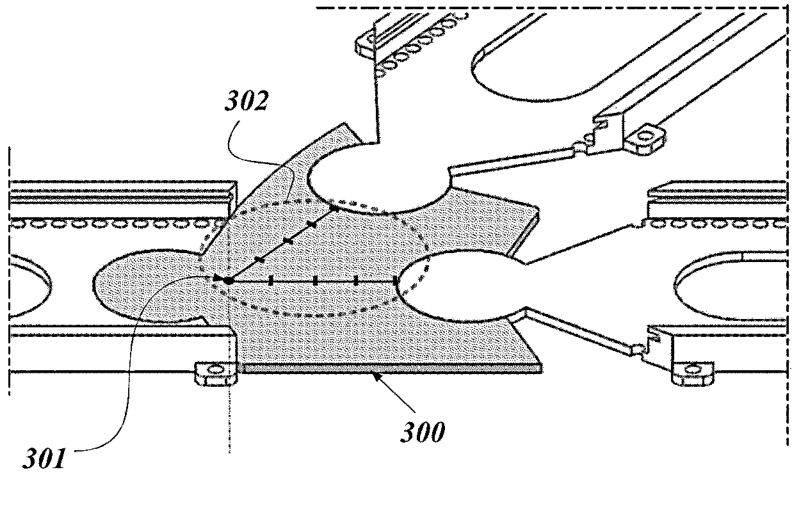

In another embodiment according to the present invention, the guide station chain may also have a branched form. FIG. 22B illustrates a branch coupler 300 proposed for this embodiment.

The branch coupler 300 has a single linking head and two linking holes, but depending on the width of the GSU, it may be configured with a larger number of linking holes.

In addition, in one embodiment according to the present invention, as described for the GSU, the branch coupler 300 has marks 302, engraved on at least one of the upper and lower sides, which indicate the length from a specific branch reference point 301 to the frontmost end of each linking hole, or the cumulative distance of sections dividing the length at regular intervals When installed on a workbench with one guide station chain branched into a plurality of guide station chains using the branch coupler 300, since the length occupied by the branch section in the branched guide station chain can be immediately known through the marks 302 on the branch coupler 300, a worker can easily determine where the BCCI should be positioned relative to the branched bundles of the harness.

In another embodiment according to the present invention, a specific GSU may have a structure of a plurality of linking holes, such as the branch coupler 300, instead of a single linking hole. Thus, if a branching guide station chain is required, the specific GSU may be used for the branching section.

Unless the various embodiments, for an instrument for checking whether the band cable is heterogeneous, described so far are incompatible with each other, the explained embodiments can be properly chosen in various ways and then combined to embody the concept and idea of the present invention.

The embodiments of the present invention described above have been introduced for the purpose of illustration. Therefore, it should be understood by those skilled in the art that modification, change, substitution, or addition to the embodiments is possible without departing from the technical principles and scope of the present invention defined by the appended claims.

What is claimed is:

1. An instrument for checking whether a band cable is heterogeneous, comprising:

an anchor block configured to have a vertically penetrating a receiving tube into which a fastener attached to a band cable can be inserted when the fastener has a specific shape;

a base platform configured to form a seating plane, on its upper surface, on which the anchor block is detachably mounted, to have a plurality of switches installed inside, each equipped with an up-down pin that can move up and down, so that they are spaced apart from each other by a certain distance and their up-down pins protrude above the seating plane by a predetermined height, and to have connection terminals on its outer surface that are electrically connected to each of the plurality of switches; and a latch plate configured to be capable of blocking at least a portion of upper side of the receiving tube.

2. The instrument of claim 1, wherein the receiving tube is formed in a structure different from the receiving tubes of one or more other anchor blocks, so that one or more band cable fasteners that can be respectively inserted into the receiving tubes of the one or more other anchor blocks are not inserted into the receiving tube.

3. The instrument of claim 1, wherein a plurality of vertically penetrating holes are formed in the anchor block, and screw holes are formed at a plurality of positions, on the seating plane, that are aligned with the holes when the anchor block is placed at a predetermined position on the seating plane.

4. The instrument of claim 1, wherein the base platform is configured to be stepped on both front and rear parts of the upper surface, a front lower stepped surface made due to the step forms the seating plane, a knob is mounted on a rear lower stepped surface made due to the step, and the latch plate having a length extending to a front border of the at least portion is coupled to upper side of the knob.

5. The instrument of claim 4, wherein the knob is mounted to slide forward and backward along at least one axis inserted into a support wall formed between the front lower step surface and the rear lower step surface, and an elastic member for accumulating elastic force during rearward slide of the knob is provided in the support wall or in the knob.

6. The instrument of claim 5, wherein the base platform is configured so that the knob has a slide operation distance to allow front end of the latch plate to be positioned further rearward than rear end of the seating plane.

7. The instrument of claim 5, wherein a portion of a specific surface of the anchor block, which faces the support wall when the anchor block is mounted on the seating plane, is recessed inward to form a recess extending from top to bottom.

8. The instrument of claim 7, wherein the latch plate is configured to have a fore part that includes a portion that covers top of the recess when the knob is slid rearward by maximum operation distance, and to have a width narrower than a width of the recess, and wherein a pillar, whose width matches the width of the recess, protrudes forward on the support wall.

9. The instrument of claim 4, wherein a through hole is formed in the latch plate, a screw hole is formed at top of the knob, the latch plate is fixedly coupled to the upper side of the knob by a single fastening means that is inserted into the through hole and screwed into the screw hole, and the fastening means has a handle on its upper portion that can be held and rotated by hand.

10. The instrument of claim 9, wherein a concavo-convex structure that can be fitted and assembled with each other is formed on both surfaces of the latch plate and the knob that face each other when they are coupled.

11. The instrument of claim 4, wherein the latch plate is configured to include a fixed plate coupled to the knob, and a non-fixed plate assembled by being fitted with the fixed plate with one side partially facing one side of the fixed plate, and the non-fixed plate can slide relative to the fixed plate in a state that it is assembled to the fixed plate.

12. The instrument of claim 4, wherein the knob is configured to form a fixing member at its top that opens in front of the knob and forms a tunnel therein with a predetermined length in a direction perpendicular to the opening direction on a horizontal plane, the latch plate is configured to have a guide bar formed at one end thereof, and to be assembled to the knob to enable relative sliding with respect to the knob by inserting the guide bar into the tunnel along its longitudinal direction, and the tunnel has a cross section that prevents the guide bar from rotating upward.

13. The instrument of claim 4, wherein a pair of axial walls, which are provided with opposing holes, are respectively formed on both sides of the upper side of the knob, the latch plate is configured to have a shaft rod at one end, and to be assembled to the knob in a state in which it can be rotated up and down around the shaft rod by inserting both ends of the shaft rod into the pair of opposing holes, respectively, and a locking member is installed, at top of at least one of the pair of axial walls, that can cover or open a portion of top of the latch plate through rotating around a vertical axis.

14. The instrument of claim 1, wherein at least a portion of the latch plate is configured to be moved in whole or in part relative to the base platform while being mounted on the instrument, thereby exposing entire upper surface of the anchor block.

15. The instrument of claim 14, wherein the base platform is configured to be stepped on front part of its upper surface so that a lower stepped surface made due to the step forms the seating plane and a support wall is formed behind the seating plane, and to form a pair of axial walls, which are provided with a pair of holes facing each other, on both sides of top surface of the support wall, wherein the latch plate is configured to have an axial rod at one end, and both ends of the axial rod are respectively inserted into the pair of holes, so that the latch plate is assembled to the support wall in a state where it can rotate up and down with the axial rod as an axis, and wherein a locking member is installed, at top of at least one of the pair of axial walls, that can cover or open a portion of top of the latch plate through rotating around a vertical axis.

16. The instrument of claim 15, wherein a space is formed in at least one of the pair of axial walls from top thereof to a height lower than top of the support wall, and a pivotable hook of a predetermined length is installed in the space so that it can rotate around a lower rotating axis in a direction toward the latch plate and in a reverse direction, wherein the pivotable hook is configured to have a head with at least one side protruding perpendicularly to a longitudinal direction, and an upper side of the head includes an inclined section whose height decreases toward a protruding end, and wherein an elastic member is mounted between a first side of the pivotable hook facing in the reverse direction and a second side of the space facing the first side.

17. The instrument of claim 16, wherein the latch plate and the pivotable hook are configured and installed so that when the latch plate rotates downward around the axial rod, one side thereof abuts the inclined section of the pivotable hook.

18. The instrument of claim 15, further comprising at least one ejector, whose length can vary in its longitudinal direction, that is installed on an upper side of the support wall with its longitudinal direction being vertical, wherein the ejector is installed so that a top side of its part whose length does not change is no higher than a top side of the support wall.

19. The instrument of claim 18, wherein the ejector comprises:

a housing with an opening on one side;

an elastic member mounted in the housing and having elastic force; and an actuator configured to protrude out of the housing through the opening when the compressed elastic member is extended by the elastic force.

20. The instrument of claim 14, wherein a fore part of the latch plate, which is within a predetermined length from front end, is formed to have a relatively narrower width.

21. The instrument of claim 1, wherein each of the plurality of switches includes a housing barrel into which the up-down pin is slidably inserted, and a connection ball, which is in contact with the housing barrel due to elastic force of an elastic member, forms part of an electrical connection between the switch and the connection terminal.

22. The instrument of claim 21, wherein a passage from the connection terminal to the switch, in which the connection ball is installed, is formed in a structure such that only a part of the connection ball protrudes from the passage into a vertical hole that becomes empty when the switch is removed from the base platform.

23. The instrument of claim 1, wherein each of the plurality of switches includes a housing barrel into which the up-down pin is slidably inserted, and a movable rod that starts to move together when the up-down pin is inserted a predetermined distance or more into the housing barrel, and wherein the movable rod and the connection terminal are electrically connected.

24. The instrument of claim 1, further comprising one or more guide station units on which the base platform can be detachably mounted wherein each of the one or more guide station units comprises a base panel having a predetermined width and a length longer than the width, and both side walls standing vertically on both sides of the base panel, and parallel to each other in a longitudinal direction of the base panel, and wherein rails are formed on opposing surfaces of the both side walls in the longitudinal direction, and at least one passage hole penetrating vertically to have a length longer than its width is formed in the base panel along the longitudinal direction.

25. The instrument of claim 24, wherein one and other ends of the base panel are formed in a structure that can be engaged with each other.

26. The instrument of claim 25, further comprising a branch coupler, one end of which is formed in a structure capable of engaging with one end of the base panel, and other end of which is formed with a structure including a plurality of shapes, each forming a structure that can be engaged with one end of the base panel.

27. The instrument of claim 24, wherein locking holes are formed continuously in the longitudinal direction in the guide station unit, and a locking member capable of fixing the base platform to an arbitrary position, when the base platform is mounted to slide along the rails, is inserted into one of the locking holes.

* * * * *